(12) United States Patent
Hosotani et al.

(10) Patent No.: US 7,751,235 B2
(45) Date of Patent: Jul. 6, 2010

(54) SEMICONDUCTOR MEMORY DEVICE AND WRITE AND READ METHODS OF THE SAME

(75) Inventors: Keiji Hosotani, Sagamihara (JP); Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 371 days.

(21) Appl. No.: 11/959,897

(22) Filed: Dec. 19, 2007

(65) Prior Publication Data

US 2008/0151608 A1    Jun. 26, 2008

(30) Foreign Application Priority Data

Dec. 20, 2006    (JP)    ............... 2006-343165

(51) Int. Cl.
*G11C 11/15*    (2006.01)
(52) U.S. Cl. ............... 365/173; 365/158; 365/148; 365/225.5; 365/243.5; 977/935
(58) Field of Classification Search ............... 365/48, 365/66, 78, 80–93, 100, 130, 131, 148, 158, 365/171, 173, 225.5, 243.5; 216/22; 257/421, 257/E21.665; 438/3; 977/933–935
See application file for complete search history.

(56) References Cited

U.S. PATENT DOCUMENTS

| 6,670,660 | B2 | 12/2003 | Hosotani |
| 6,674,142 | B2 | 1/2004 | Hosotani |
| 6,697,294 | B1 * | 2/2004 | Qi et al. ............ 365/210.15 |
| 6,861,314 | B2 | 3/2005 | Hosotani |

FOREIGN PATENT DOCUMENTS

AO    2004-517504    6/2004

WO    WO 02/059898 A2    8/2002

OTHER PUBLICATIONS

U.S. Appl. No. 12/273,874, filed Nov. 19, 2008, Hosotani et al.
Roy Scheuerlein, et al., "A 10ns Read and Write Non-Volatile Memory Array Using a Magnetic Tunnel Junction and FET Switch in each Cell", IEEE International Solid-State Circuits Conference, 2000, 2 pages.
M. Durlam, et al., "Nonvolatile RAM based on Magnetic Tunnel Junction Elements", IEEE International Solid-State Circuits Conference, 2000, 2 pages.
W.C. Jeong, et al., "Highly scalable MRAM using field assisted current induced switching", Symposium on VLSI Technology Digest of Technical Papers, 2005, pp. 184-185.
S. Mangin, et al., "Current-induced magnetization reversal in nanopillars with perpendicular anisotropy", Nature Materials, vol. 5, Mar. 2006, pp. 210-215.

* cited by examiner

*Primary Examiner*—J. H. Hur
*Assistant Examiner*—Harry W Byrne
(74) *Attorney, Agent, or Firm*—Oblon, Spivak, McClelland, Maier & Neustadt, L.L.P.

(57) ABSTRACT

A semiconductor memory device includes first to fourth resistance change elements sequentially arranged apart from each other in a first direction, a first electrode which connects one terminals of the first and second resistance change elements, a second electrode which connects one terminals of the third and fourth resistance change elements, a bit line which connects the other terminals of the second and third resistance change elements, first to fourth word lines respectively paired with the first to fourth resistance change elements, arranged apart from the first and second electrodes, and running in a second direction, a first current source which supplies a first electric current to a chain structure, when writing data in a selected element, and a second current source which supplies a second electric current to a selected word line which corresponds to the selected element, when writing the data in the selected element.

20 Claims, 25 Drawing Sheets

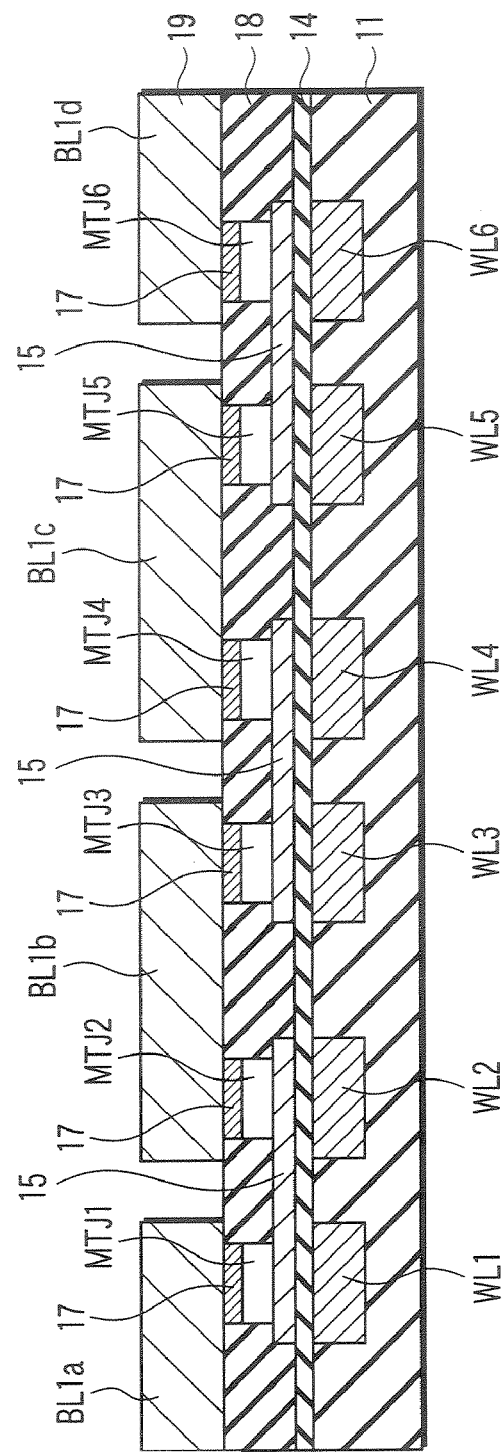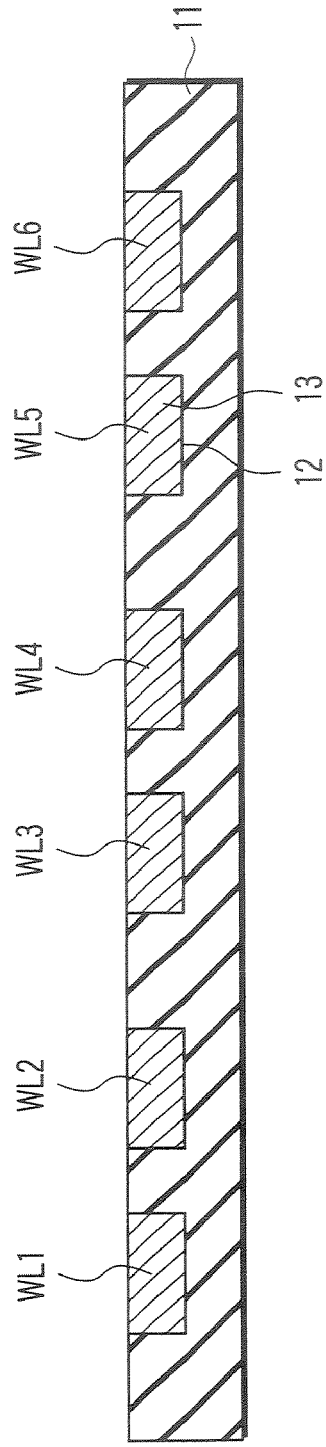
F I G. 1
F I G. 2

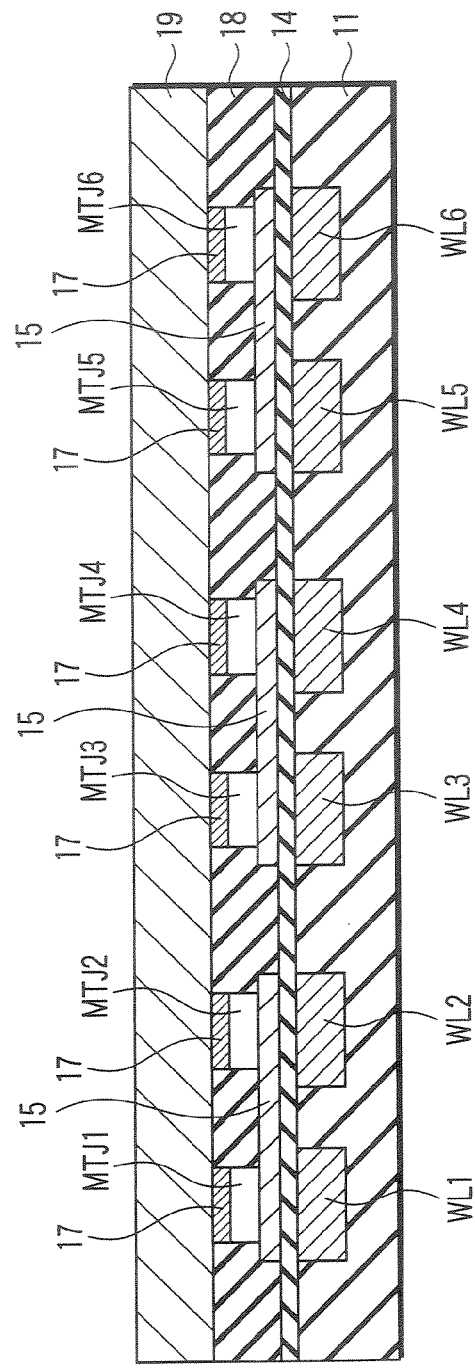
F I G. 5
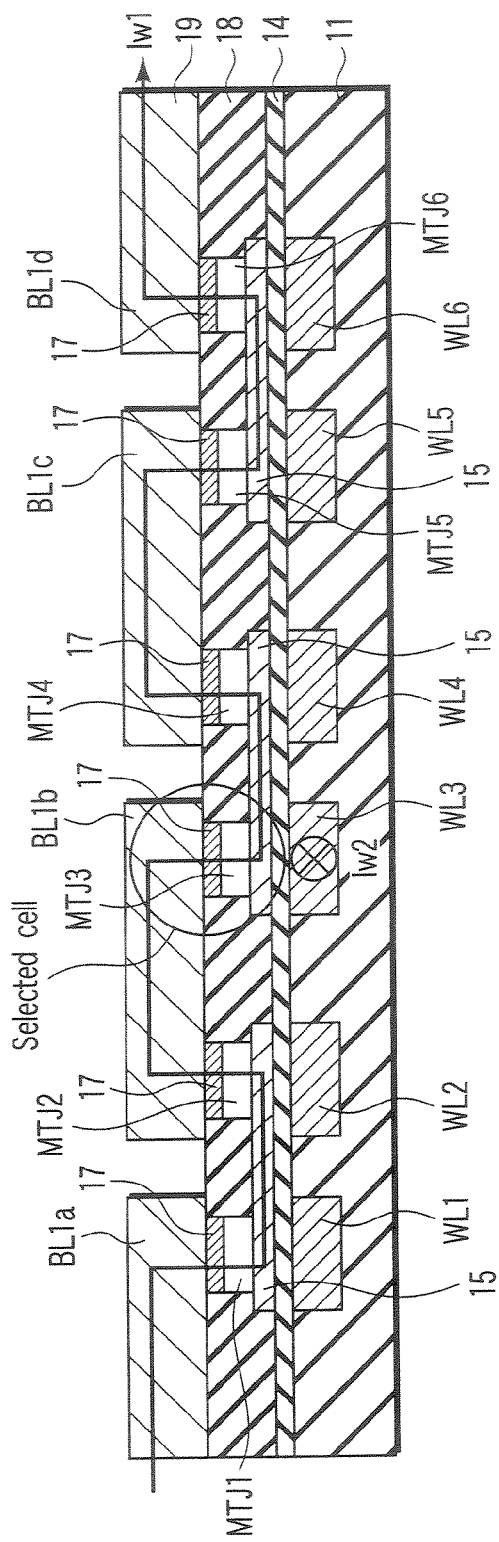
F I G. 6

| Initial | First cycle<br>"0"-expected write | Second cycle<br>"1"-expected write | Third cycle<br>Write back |
|---|---|---|---|
| "0" | Ω1=(No change) | Ω2=(Resistance ↑) | "0" |
| "1" | Ω1=(Resistance ↓) | Ω2=(No change) | "1" |

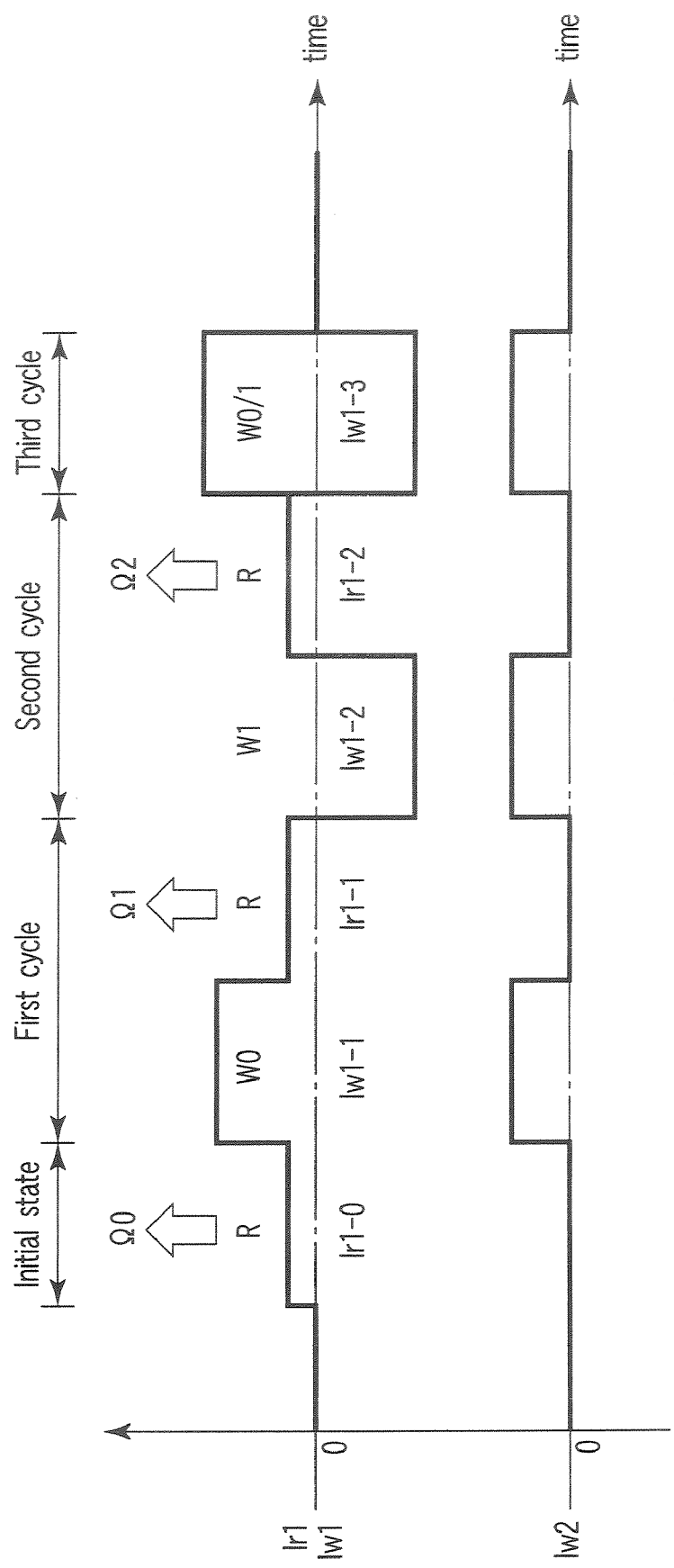
F I G. 10

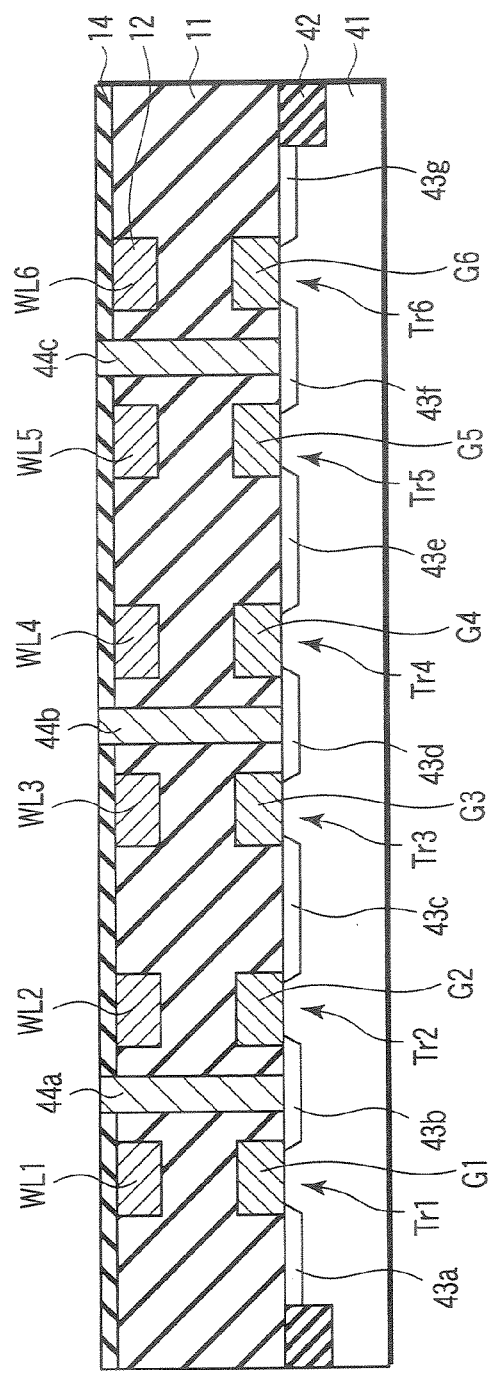
F I G. 23
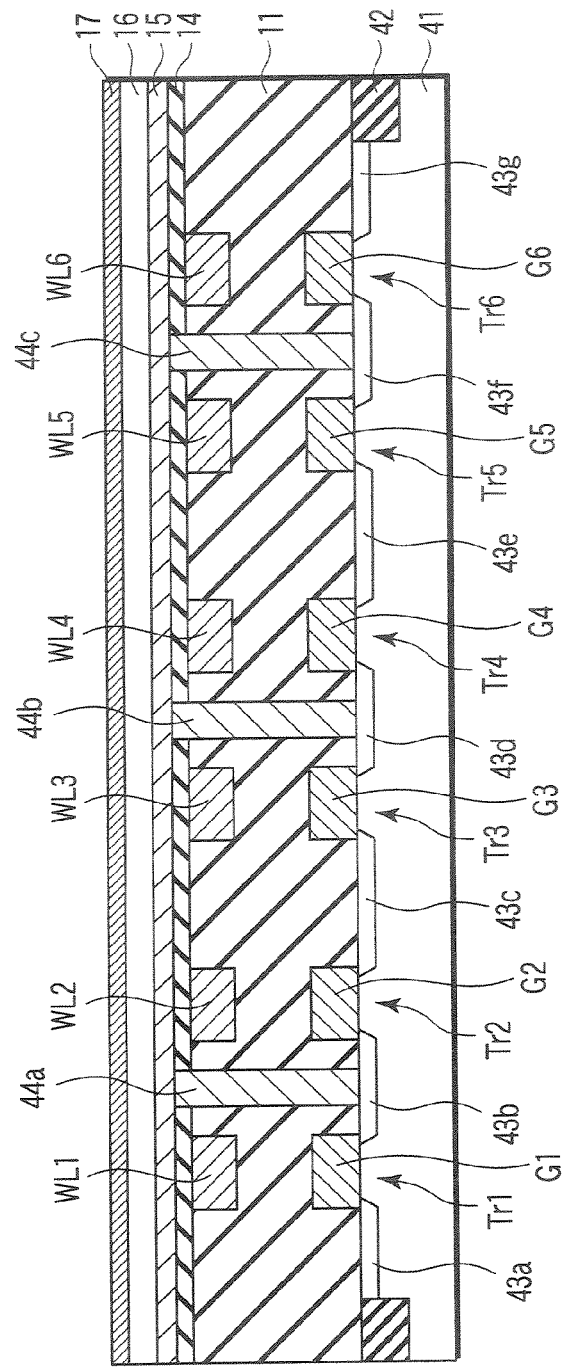
F I G. 24

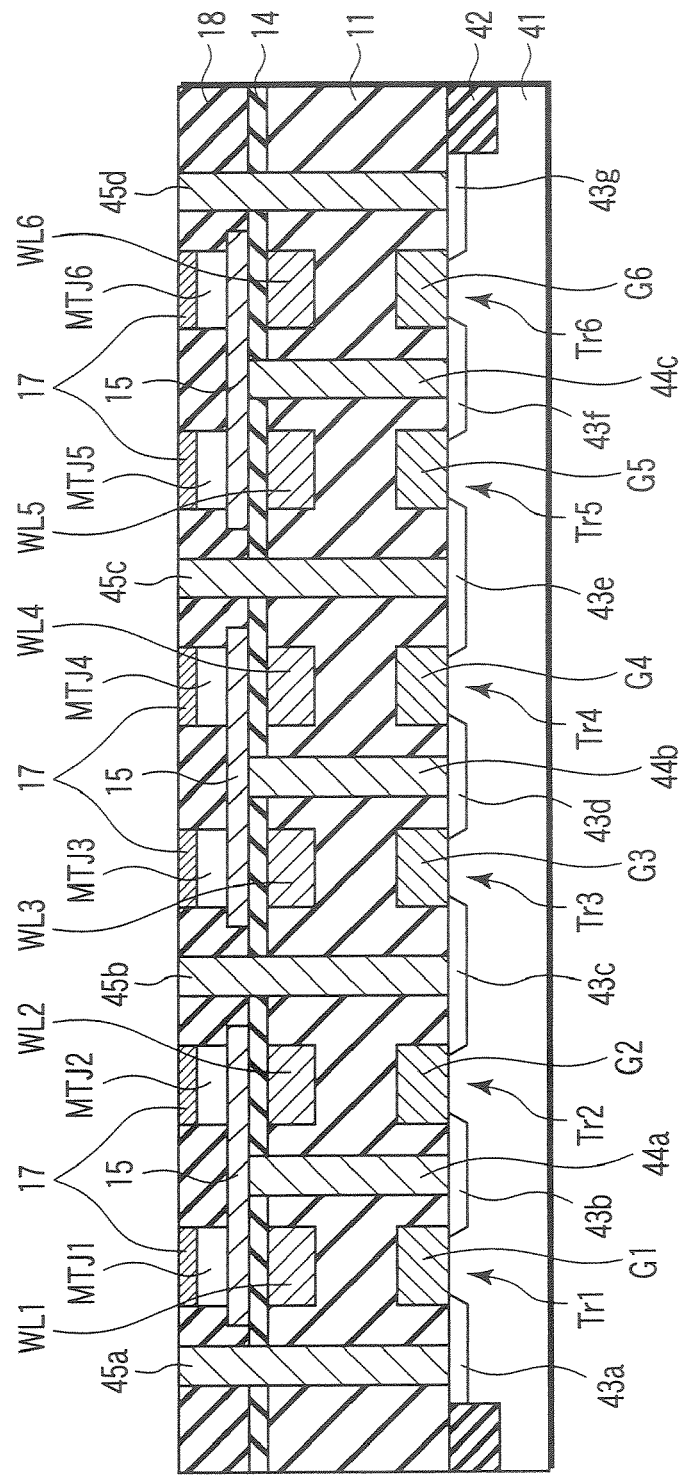
F I G. 26

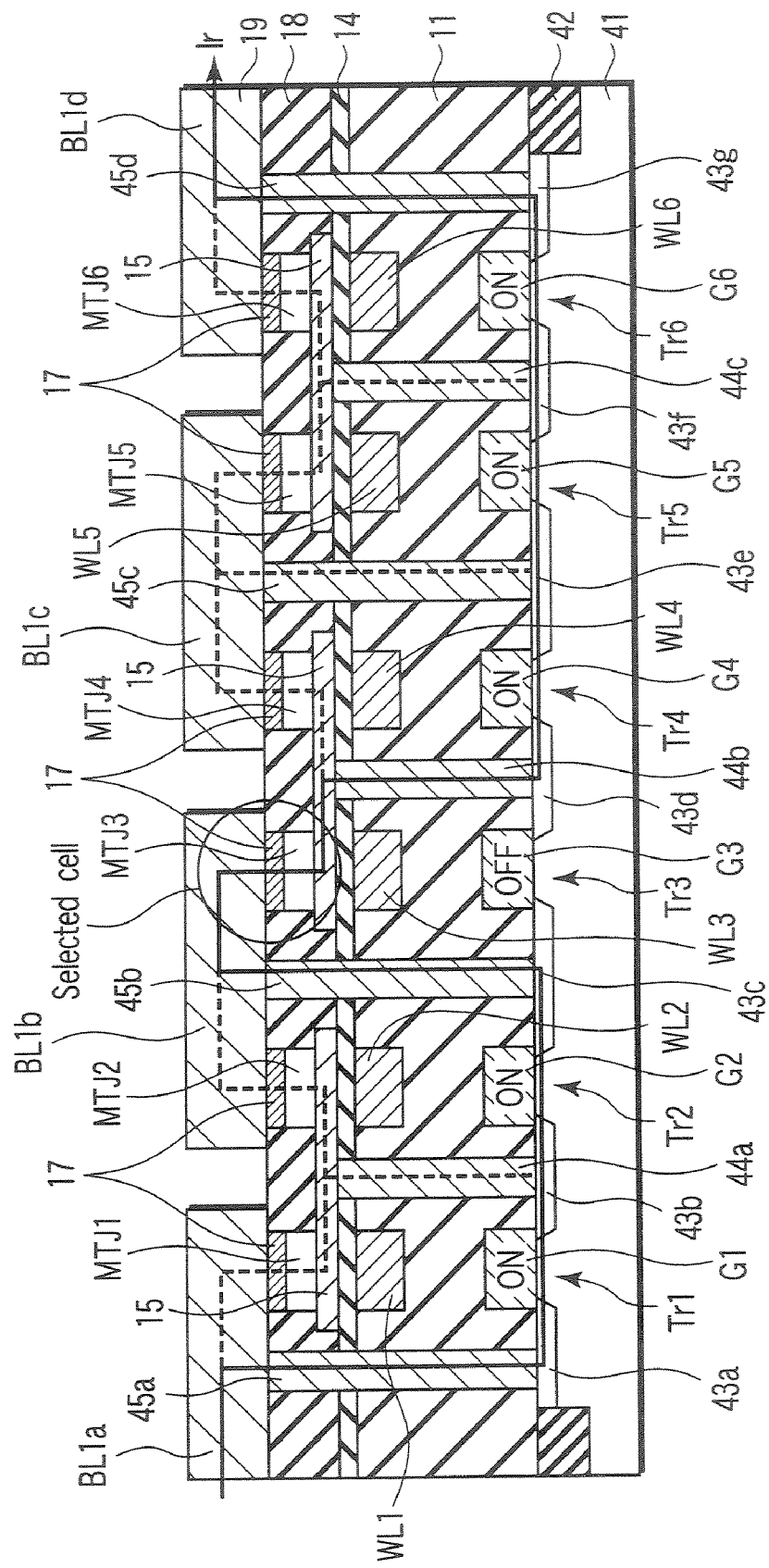
F I G. 28

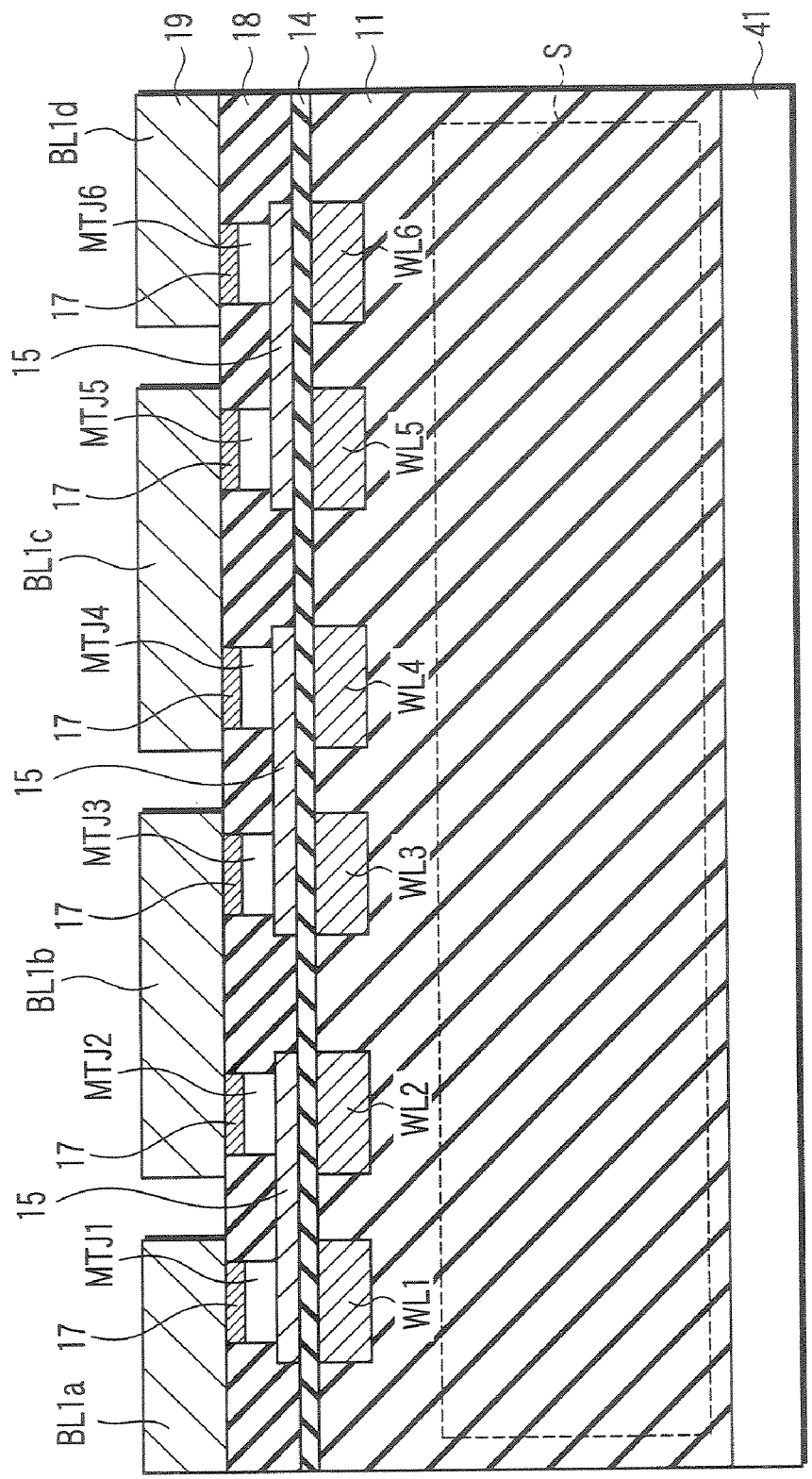
F I G. 33

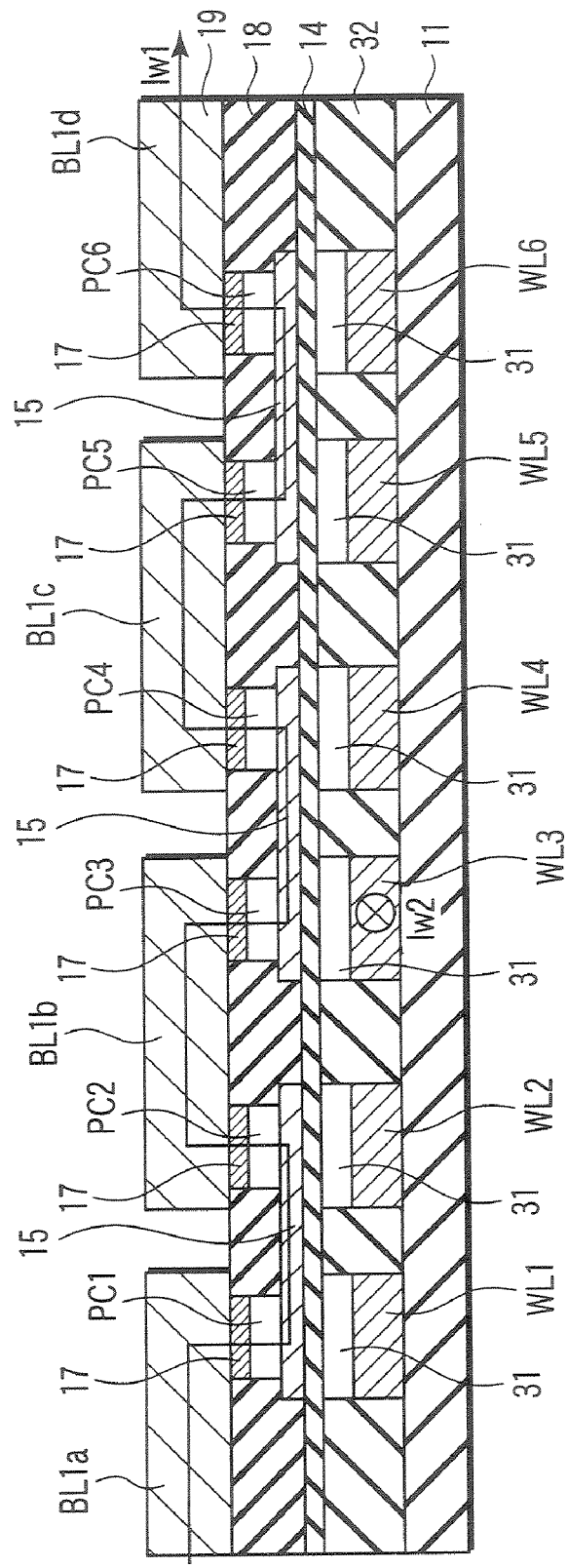
F I G. 34

SEMICONDUCTOR MEMORY DEVICE AND WRITE AND READ METHODS OF THE SAME

CROSS-REFERENCE TO RELATED APPLICATIONS

This application is based upon and claims the benefit of priority from prior Japanese Patent Application No. 2006-343165, filed Dec. 20, 2006, the entire contents of which are incorporated herein by reference.

BACKGROUND OF THE INVENTION

1. Field of the Invention

The present invention relates to a semiconductor memory device including resistance change elements having a chain structure, and write and read methods of the same.

2. Description of the Related Art

Recently, a number of memories that store information by new principles have been proposed. An MRAM (Magnetic Random Access Memory) using the TMR (Tunneling Magneto Resistive) effect is one of these memories.

A memory cell of this MRAM comprises, e.g., an MTJ (Magnetic Tunnel Junction) element and switching element. Letting F (Feature size: a minimum processing dimension) be the short side of the MTJ element and 2 F be its long side, the cell size is 12 $F^2$ when a MOSFET is used as the switching element. This cell size is larger than that of a DRAM or flash memory. Therefore, a method that forms a bit line for easy axis write below the MTJ element and forms the lower electrode and the fringe of this contact in self-alignment is sometimes used. In this case, the cell size decreases to 10 $F^2$, but this cell size is still unsatisfactory for micropatterning.

To achieve a 256-Mbit class, large-capacity MRAM, it is necessary to decrease the cell area to about 1 $\mu m^2$ or less and downsize a peripheral circuit of the cell. To decrease the cell area to about 1 $\mu m^2$ or less, F of the cell design rule must be decreased to about 0.13 $\mu m$. To miniaturize the peripheral circuit of the cell and decrease the ratio occupied by the cell to about 0.6, it is essential to decrease the value of a cell write current to about 1 mA or less. When the cell width F is about 0.4 $\mu m$, however, even the smallest write current value of the presently reported MTJ elements is about 8 to 10 mA (e.g., non-patent references 1 and 2).

In the recently reported spin injection type MRAM, an electric current is supplied perpendicularly to the film surface of the MTJ element, and spins are injected into a recording layer in accordance with the flowing direction of the electric current, thereby causing magnetization reversal. When the MTJ element for spin injection is a perpendicular magnetization type element, the element need only be given uniaxial anisotropy in the direction perpendicular to the film surface; the element need not be given shape magnetic anisotropy in the direction of the film surface unlike in a planar magnetization type (parallel magnetization type) element. Accordingly, it is in principle possible to miniaturize the MTJ element to its processing limit by setting its aspect ratio at 1. In addition, this MTJ element obviates the need for current magnetic field interconnections for generating current magnetic fields in different directions for two axes, unlike in a planar magnetization type element; the MTJ element can operate if only two terminals connecting to the upper and lower electrodes of the MTJ element exist. Consequently, the cell area per bit can be reduced (e.g., non-patent reference 3).

Unfortunately, to use one MOSFET as a switching element for one MTJ element, this MOSFET must have a size that makes it possible to supply an electric current necessary to cause magnetization reversal in the MTJ element. Also, the cell size is difficult to decrease because reducing the write current is an essential subject. Furthermore, the conventional cell structure makes it difficult to three-dimensionally stack MTJ elements. This makes the cell density difficult to greatly increase.

[Non-patent Reference 1] Roy Scheuerlein et al., "A 10 ns R and W Non-Volatile Memory Array Using a Magnetic Tunnel Junction and FET Switch in each Cell", ISSCC2000 Technical Digest pp. 128-129

[Non-patent Reference 2] M. Durlam et al., "Nonvolatile RAM based on Magnetic Tunnel Junction Elements", 2000 IEEE

[Non-patent Reference 3] W. C. Jeong et al., "High scalable MRAM using field assisted current induced switching", 2005 VLSI Sympo. Technical Digest pp. 184-185

[Non-patent Reference 4] S. Mangin et al., Nature Materials, Vol. 5, March 2006

[Patent Reference 1] Jpn. Pat. Appln. KOKAI Publication No. 2004-517504

BRIEF SUMMARY OF THE INVENTION

A semiconductor memory device according to the first aspect of the present invention comprising a first resistance change element, a second resistance change element, a third resistance change element, and a fourth resistance change element sequentially arranged apart from each other in a first direction, and configured to record data when an electric current flows perpendicularly to a film surface, a first electrode which connects one terminal of the first resistance change element and one terminal of the second resistance change element, a second electrode which connects one terminal of the third resistance change element and one terminal of the fourth resistance change element, a bit line which connects the other terminal of the second resistance change element and the other terminal of the third resistance change element, a first word line, a second word line, a third word line, and a fourth word line respectively paired with the first resistance change element, the second resistance change element, the third resistance change element, and the fourth resistance change element, arranged apart from the first electrode and the second electrode, and running in a second direction different from the first direction, a first current source which supplies a first electric current to a chain structure having the first resistance change element, the second resistance change element, the third resistance change element, and the fourth resistance change element, the first electrode, the second electrode, and the bit line, when writing data in a selected element among the first resistance change element, the second resistance change element, the third resistance change element, and the fourth resistance change element, and a second current source which supplies a second electric current to a selected word line, among the first word line, the second word line, the third word line, and the fourth word line, which corresponds to the selected element, when writing the data in the selected element.

A write method of a semiconductor memory device according to the second aspect of the present invention, wherein the semiconductor memory device comprises a first resistance change element, a second resistance change element, a third resistance change element, and a fourth resistance change element sequentially arranged with a predetermined interval therebetween in a first direction, and configured to record data when an electric current flows perpendicularly to a film surface, a first electrode which connects one terminal of the first resistance change element and one terminal of the second resistance change element, a second electrode which connects one terminal of the third resistance change element and one terminal of the fourth resistance change element, a bit line which connects the other terminal of the second resistance change element and the other terminal of the third resistance change element, and a first word line, a second word line, a third word line, and a fourth word line respectively paired with the first resistance change element, the second resistance change element, the third resistance change element, and the fourth resistance change element, arranged apart from the first electrode and the second electrode, and running in a second direction different from the first direction, and when writing data in a selected element among the first resistance change element, the second resistance change element, the third resistance change element, and the fourth resistance change element in a chain structure having the first resistance change element, the second resistance change element, the third resistance change element, the fourth resistance change element, the first electrode, the second electrode, and the bit line, while a first electric current is supplied to the chain structure to cause spin-polarized electrons to act on the selected element, a current magnetic field is applied to the selected element by supplying a second electric current to a selected word line, among the first word line, the second word line, the third word line, and the fourth word line, which corresponds to the selected element, thereby decreasing a magnetization reversal threshold value of the selected element.

A read method of a semiconductor memory device according to the third aspect of the present invention, wherein the semiconductor memory device comprises a first resistance change element, a second resistance change element, a third resistance change element, and a fourth resistance change element sequentially arranged with a predetermined interval therebetween in a first direction, and configured to record data when an electric current flows perpendicularly to a film surface, a first electrode which connects one terminal of the first resistance change element and one terminal of the second resistance change element, a second electrode which connects one terminal of the third resistance change element and one terminal of the fourth resistance change element, a bit line which connects the other terminal of the second resistance change element and the other terminal of the third resistance change element, and a first word line, a second word line, a third word line, and a fourth word line respectively paired with the first resistance change element, the second resistance change element, the third resistance change element, and the fourth resistance change element, arranged apart from the first electrode and the second electrode, and running in a second direction different from the first direction, when reading out data from a selected element among the first resistance change element, the second resistance change element, the third resistance change element, and the fourth resistance change element in a chain structure having the first resistance change element, the second resistance change element, the third resistance change element, the fourth resistance change element, the first electrode, the second electrode, and the bit line, the method comprises reading out a first resistance value of the selected element by supplying a first electric current to the chain structure, reading out a second resistance value of the selected element by supplying a second electric current to the chain structure in a direction opposite to that of the first electric current, and discriminating the data of the selected element in accordance with changes in the first resistance value and the second resistance value, and when reading out the first resistance value and the second resistance value, a third electric current is supplied to a selected word line, among the first word line, the second word line, the third word line, and the fourth word line, which corresponds to the selected element.

BRIEF DESCRIPTION OF THE SEVERAL VIEWS OF THE DRAWING

FIG. 1 is a sectional view showing a magnetic random access memory according to the first embodiment of the present invention;

FIGS. 2 to 5 are sectional views showing fabrication steps of the magnetic random access memory according to the first embodiment of the present invention;

FIG. 6 is a view for explaining the write operation of the magnetic random access memory according to the first embodiment of the present invention;

FIG. 10 is a timing chart of the read operation of the magnetic random access memory according to the first embodiment of the present invention;

FIGS. 23 to 26 are sectional views showing fabrication steps of the magnetic random access memory according to the fourth embodiment of the present invention;

FIG. 28 is a view for explaining the read operation of the magnetic random access memory according to the fourth embodiment of the present invention;

FIG. 33 is a sectional view showing a magnetic random access memory according to the ninth embodiment of the present invention;

FIG. 34 is a sectional view showing a phase change memory according to the 10th embodiment of the present invention;

DETAILED DESCRIPTION OF THE INVENTION

Figure 3:
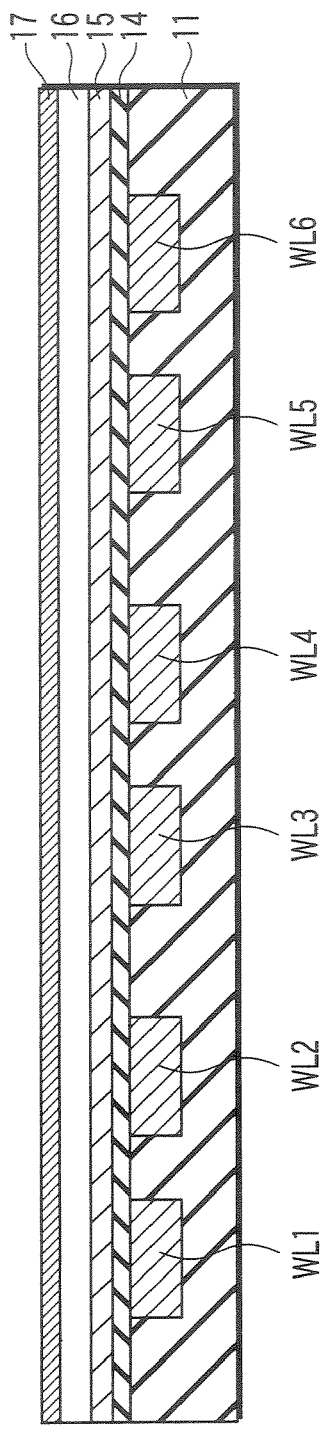

Embodiments of the present invention will be explained below with reference to the accompanying drawing. In the following explanation, the same reference numerals denote the same parts throughout the drawing.

[1] First Embodiment

In the first embodiment, a magnetic random access memory (MRAM) is taken as an example of a semiconductor memory devices and a plurality of MTJ (Magnetic Tunnel Junction) elements as resistance change elements have a chain structure.

[1-1] Structure of Magnetic Random Access Memory

FIG. 1 is a sectional view of a magnetic random access memory according to the first embodiment of the present invention. The structure of the magnetic random access memory according to the first embodiment will be explained below.

As shown in FIG. 1, MTJ elements MTJ1 to MTJ6 are arranged with predetermined intervals between them above a semiconductor substrate (not shown) in the lateral direction of the drawing surface. Data is recorded in the MTJ elements MTJ1 to MTJ6 by supplying an electric current in a direction perpendicular to the film surface. A conductive contact layer 17 is stacked on each of the MTJ elements MTJ1 to MTJ6. The contact layers 17 are integrated with the MTJ elements MTJ1 to MTJ6 and have the same planar shape as the MTJ elements MTJ1 to MTJ6.

Lower electrodes 15 connect the lower portions of the MTJ elements MTJ1 and MTJ2, those of the MTJ elements MTJ3 and MTJ4, and those of the MTJ elements MTJ5 and MTJ6. A bit line BL1$b$ connects the upper portions of the MTJ elements MTJ2 and MTJ3 via the contact layers 17. A bit line BL1$c$ connects the upper portions of the MTJ elements MTJ4 and MTJ5 via the contact layers 17. A bit line BL1$a$ connects the upper portions of the MTJ element MTJ1 and an adjacent MTJ element (not shown) via the contact layers 17. A bit line BL1$d$ connects the upper portions of the MTJ element MTJ6 and an adjacent MTJ element (not shown) via the contact layers 17.

Word lines WL1 to WL6 paired with the MTJ elements MTJ1 to MTJ6 are formed immediately below the MTJ elements MTJ1 to MTJ6. The word lines WL1 to WL6 respectively oppose the MTJ elements MTJ1 to MTJ6. The word lines WL1 to WL6 run apart from the lower electrodes 15 in the direction perpendicular to the drawing surface.

As described above, the magnetic random access memory according to the first embodiment has a chain structure in which the components are connected in the order of bit line BL1$a$ →MTJ element MTJ1 →lower electrode 15 →MTJ element MTJ2 →bit line BL1$b$ →MTJ element MTJ3 →lower electrode 15 →MTJ element MTJ4 →bit line BL1$c$ →MTJ element MTJ5 →lower electrode 15 →MTJ element MTJ6 →bit line BL1$d$.

A first current source (not shown) for supplying an electric current to the chain structure as described above when writing data in a selected cell is connected to the end portions (e.g., the bit lines BL1$a$ and BL1$d$) of the chain structure. The first current source can be formed for only one end portion (e.g., the bit line BL1$a$ or BL1$d$) of the chain structure, or for both the end portions (e.g., the bit lines BL1$a$ and BL1$d$) of the chain structure.

A second current source (not shown) for supplying an electric current to a word line corresponding to a selected cell is connected to the end portions of the word lines WL1 to WL6. The second current source can be formed for only one end portion of each of the word lines WL1 to WL6, or for both the end portions of each of the word lines WL1 to WL6. Furthermore, the second current source can be formed for each of the word lines WL1 to WL6, or shared by the word lines WL1 to WL6.

[1-2] Method of Fabricating Magnetic Random Access Memory

FIGS. 2 to 5 are sectional views showing fabrication steps of the magnetic random access memory according to the first embodiment of the present invention. A method of fabricating the magnetic random access memory according to the first embodiment will be explained below.

First, as shown in FIG. 2, an insulating film 11 is formed on a semiconductor substrate (not shown) having CMOS circuits, multilayered interconnections, and the like, and trenches 12 are formed in the insulating film 11. Then, a barrier metal film (not shown) made of, e.g., Ta or TaN is formed, and a metal material 13 made of, e.g., Cu is formed on this barrier metal film by plating. The metal material 13 is planarized by CMP (Chemical Mechanical Polish), and buried in the trenches 12. In this manner, word lines WL1 to WL6 made of the metal material 13 are formed in the trenches 12.

Subsequently, as shown in FIG. 3, an anti-oxidizing, insulating liner film 14 made of, e.g., SiN is formed on the word lines WL1 to WL6 and insulating film 11. A lower electrode 15, MTJ film 16, and contact layer 17 are stacked on the liner film 14.

Figure 4:
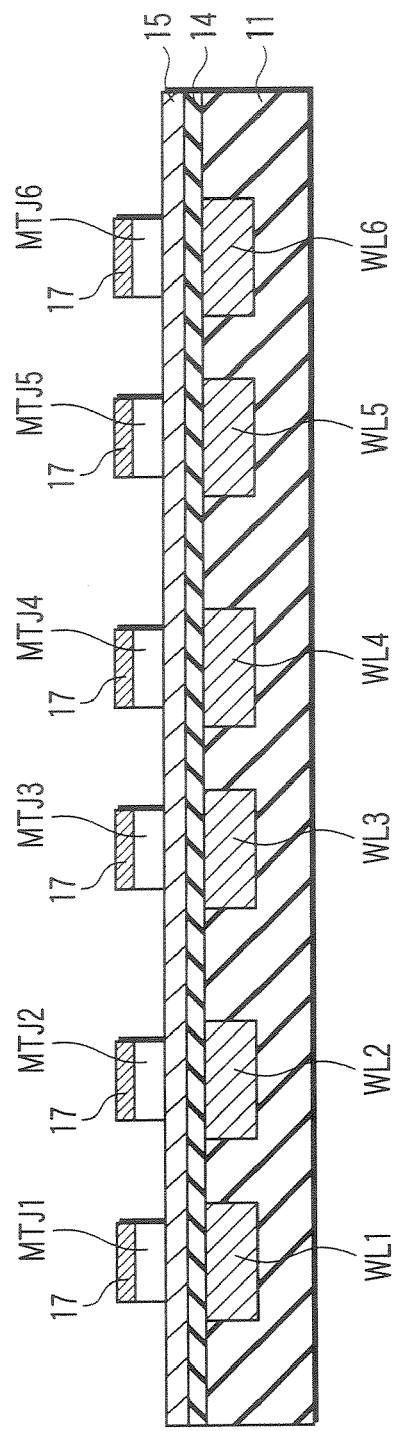

As shown in FIG. 4, the contact layer 17 and MTJ film 16 are simultaneously processed by RIE (Reactive Ion Etching), ion milling, and the like by using the lower electrode 15 as a stopper. In this way, MTJ elements MTJ1 to MTJ6 are separated for individual cells.

As shown in FIG. 5, the lower electrode 15 is processed into a predetermined shape. After that, an $SiO_x$-based insulating film 18 is buried by using the HDP (High Density Plasma) method or the like. The insulating film 18 is then planarized by using CMP, thereby exposing the contact layers 17. Subsequently, a barrier metal film (not shown) made of, e.g., Ti or TiN and an interconnection material 19 made of, e.g., AlCu are stacked.

Then, as shown in FIG. 1, the interconnection material 19 is processed by using conventional lithography and RIE, thereby forming bit lines BL. Finally, a memory cell portion is completed by forming a passivation film (not shown).

[1-3] Write Method

The write method of the first embodiment uses the spin injection magnetization reversal technique. The theory of spin injection magnetization reversal is based on the following relations. Note that details are described in non-patent reference 4.

A magnetization reversal current Ic of spin injection write in a parallel magnetization type MTJ element is indicated by expression (1) and expression (2). Expression (1) indicates the case where the magnetization state changes from parallel (P) to antiparallel (AP). Expression (2) indicates the case where the magnetization state changes from antiparallel (AP) to parallel (P).

Parallel Magnetization Type $$I_C^{P-AP} \approx \frac{A\alpha M_s V}{g(0)p}(H + H_{dip} + H_k // + 2\pi M_s) \quad \text{Expression (1)}$$

$$I_C^{AP-P} \approx \frac{A\alpha M_s V}{g(\pi)p}(H + H_{dip} - H_k // - 2\pi M_s) \quad \text{Expression (2)}$$

where $M_S$: the saturation magnetization of a recording layer, V: the volume of the recording layer, $\alpha$: the Gilbert damping constant of the recording layer, A: a constant concerning a transport model, H: an application magnetic field (in the longitudinal direction) in the longitudinal direction of a wafer, $H_{dip}$: a leakage magnetic field (in the longitudinal direction) from a fixed layer, P: the spin polarization ratio, $H_{k//}$: an anisotropic magnetic field (in the longitudinal direction), and g: a coefficient concerning the relative angle the recording layer makes with the pinned layer.

The magnetization reversal current Ic of spin injection write in a perpendicular magnetization type MTJ element is indicated by expression (3) and expression (4). Expression (3) indicates the case where the magnetization state changes from parallel (P) to antiparallel (AP). Expression (4) indicates the case where the magnetization state changes from antiparallel (AP) to parallel (P).

Perpendicular Magnetization Type $$I_C^{P-AP} \approx \frac{A\alpha M_s V}{g(0)p}(H_{k\perp} - 4\pi M_s - H - H_{dip}) \quad \text{Expression (3)}$$

$$I_C^{AP-P} \approx \frac{A\alpha M_s V}{g(\pi)p}(-H_{k\perp} + 4\pi M_s - H - H_{dip}) \quad \text{Expression (4)}$$

where $M_S$: the saturation magnetization of a recording layer, V: the volume of the recording layer, $\alpha$: the Gilbert damping constant of the recording layer, A: a constant concerning a transport model, H: an application magnetic field (in the perpendicular direction) in the longitudinal direction of a wafer, $H_{dip}$: a leakage magnetic field (in the perpendicular direction) from a fixed layer, P: the spin polarization ratio, $H_{k\perp}$: an anisotropic magnetic field (in the perpendicular direction), and g: a coefficient concerning the relative angle the recording layer makes with the fixed layer.

Figures 7A, 7B:
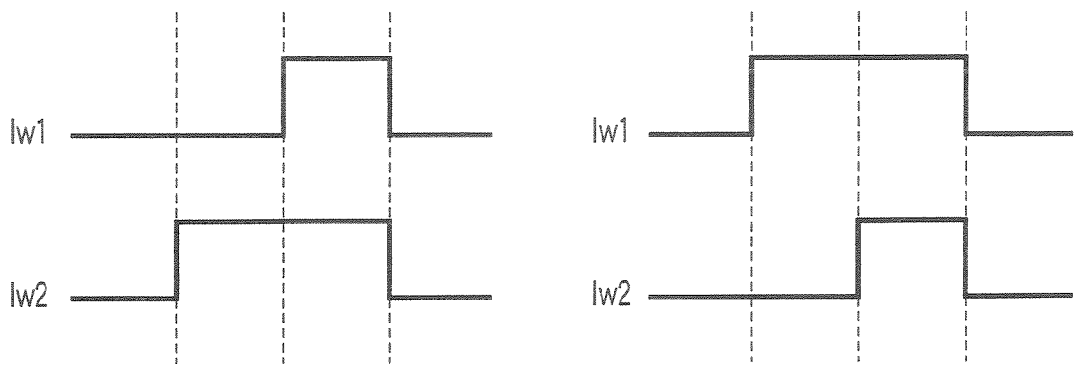
FIGS. 7A, 7B and 7C are timing charts of the write operation of the magnetic random access memory according to the first embodiment of the present invention.
Figure 7C:
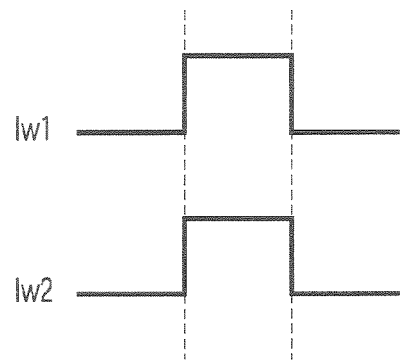
Figure 8:
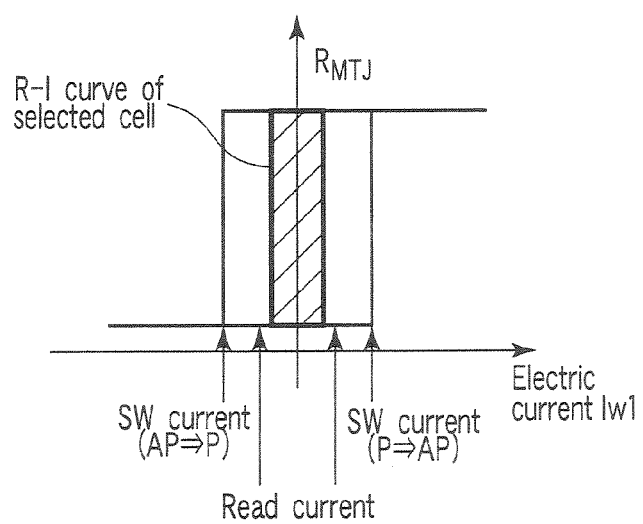
FIG. 8 is a graph showing the TMR curve of the magnetic random access memory according to the first embodiment of the present invention.

FIG. 6 is a view for explaining the write operation of the magnetic random access memory according to the first embodiment of the present invention. FIGS. 7A to 7C illustrate the timings of the write operation of the magnetic random access memory according to the first embodiment of the present invention. FIG. 8 shows the TMR curve of the magnetic random access memory according to the first embodiment of the present invention. The write operation of the magnetic random access memory according to the first embodiment will be explained below.

As shown in FIG. 6, when writing data in the MTJ element MTJ3 of a selected cell, a write current Iw1 is supplied to the chain structure, and spin-polarized electrons generated by the write current Iw1 are allowed to act on the magnetization in the recording layer of the MTJ element MTJ3. In this state, an electric current Iw2 is supplied to the word line WL3 corresponding to the MTJ element MTJ3, and a current magnetic field H generated by the electric current Iw2 is applied to the MTJ element MTJ3. Accordingly, the spin-polarized electrons generated by the electric current Iw1 and the current magnetic field H generated by the electric current Iw2 are acting on the MTJ element MTJ3 of the selected cell.

Assume that the write current Iw1 is supplied to the right in the chain structure, and the write current Iw2 is supplied such that it flows into the drawing surface. In this case, the write current Iw1 flows from the recording layer to the fixed layer (electrons flow from the fixed layer to the recording layer) in the MTJ element MTJ3 of the selected cell, and the magnetization directions in the fixed layer and recording layer become parallel. As a consequence, data "0", for example, is written.

On the other hand, assume that the write current Iw1 is supplied to the left in the chain structure, and the write current Iw2 is supplied such that it flows out from the drawing surface. In this case, the write current Iw1 flows from the fixed layer to the recording layer (electrons flow from the recording layer to the fixed layer) in the MTJ element MTJ3 of the selected cell, and the magnetization directions in the fixed layer and recording layer become antiparallel. As a consequence, data "1", for example, is written.

Note that in the write example of data "0" and "1" described above, the flowing directions of the electric current Iw2 are not limited to the above directions, and can be optimized so as to reduce the write current as much as possible.

As an example, an operation using the following longitudinal magnetization type (parallel magnetization type) MTJ element will be explained.

RA=10Ω·μm², MR=100%

When element size=0.1×0.1 μm², a resistance Rmtj of the MTJ element is 1 kΩ (a parallel state P) or 2 kΩ (an antiparallel state AP)

Reversal current threshold values are as follows.

Current density Jc=0.1 MA/cm² (when an external magnetic field is applied), current value Ic=0.01 mA Current density Jc=0.3 MA/cm² (when no external magnetic field is applied), current value Ic=0.03 mA Assuming that the chain scale is 64 bits/bit line, each element resistance value is 1 kΩ (in the parallel state P), so the resistance value is 64 kΩ for 64 bits. Therefore, the potential difference between the two sides of the bit line while the circuit is in operation is 0.64 V. On the other hand, the resistance doubles in the antiparallel state AP, so the potential difference between the two sides of the bit line when the circuit is in operation is 1.28 V.

From the above consideration, the bit line voltage during the write operation is presumably 0.64 to 1.28 V+α, and desirably, e.g., about 1.5 V. The write current Iw1 to be supplied to the chain structure is desirably 0.02 mA. The write current Iw1 is preferably controlled by using a constant-current circuit. 1 mA is preferably supplied as the write current Iw2 for applying a magnetic field, thereby applying 50 Oe to the selected cell and changing the magnetization reversal threshold value Ic.

The following three examples are possible as the supply timings of the write currents Iw1 and Iw2. As shown in FIG. 7A, the write current Iw2 is supplied first, and the write current Iw1 is supplied after that. As shown in FIG. 7B, the write current Iw1 is supplied first, and the write current Iw2 is supplied after that. As shown in FIG. 7C, the write currents Iw1 and Iw2 are simultaneously supplied. Note that in this embodiment, the BL current Iw1 is desirably supplied after a torque is given by supplying the WL current Iw2 as shown in FIG. 7A.

In the write operation as described above, the magnetization reversal threshold value Ic obtained by spin injection reduces due to the influence of the current magnetic field H in only an MTJ element MTJ immediately above a word line WL where the current magnetic field H is generated. This assisting effect of the current magnetic field allows easy magnetization reversal in only the MTJ element MTJ of the selected cell (FIG. 8). This makes it possible to cause magnetization reversal in only the selected MTJ element MTJ by the current Iw1 flowing through the chain structure.

[1-4] Read Method

The read method of the first embodiment uses the tunneling magnetoresistive effect.

Figures 9, 11:
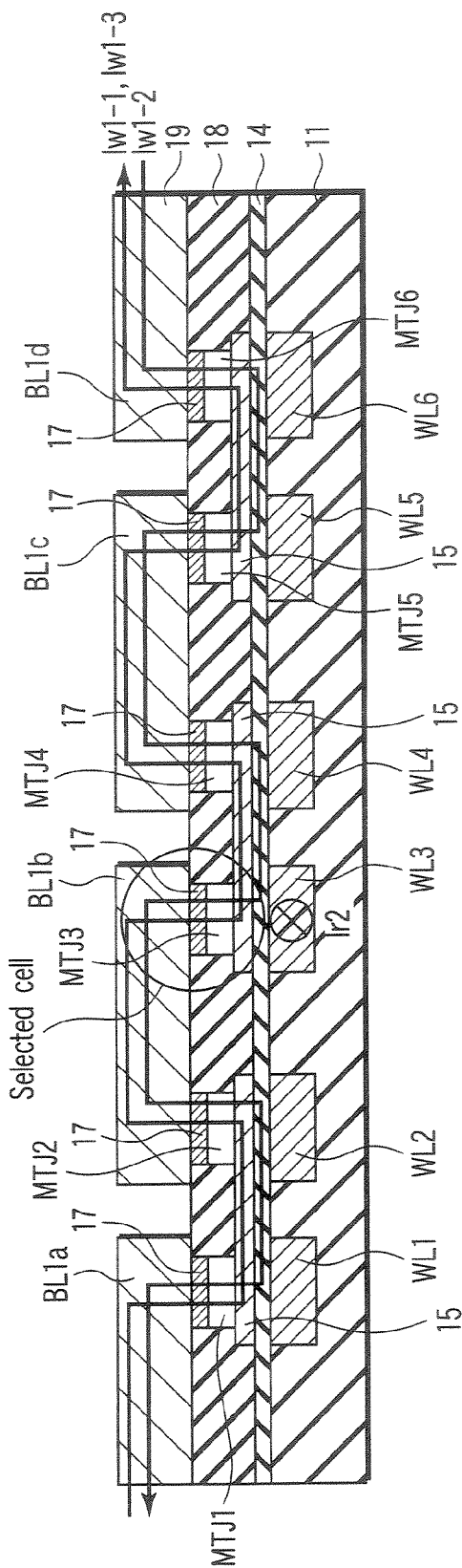
FIG. 9 is a view for explaining the read operation of the magnetic random access memory according to the first embodiment of the present invention.
FIG. 11 is a view showing the expected values of the read operation of the magnetic random access memory according to the first embodiment of the present invention.

FIG. 9 is a view for explaining the read operation of the magnetic random access memory according to the first embodiment of the present invention. FIG. 10 shows the timings of the read operation of the magnetic random access memory according to the first embodiment of the present invention. FIG. 11 shows the expected values of the read operation of the magnetic random access memory according to the first embodiment of the present invention. The read operation of the magnetic random access memory according to the first embodiment will be explained below.

First, the read operation of this embodiment basically has three cycles as shown in FIG. 10. The first and second cycles each include a read operation (R) and write operation (W). A write operation (W0/1) in the third cycle is a data write back step. Since the direction in which an electric current Iw1-3 flows changes in accordance with the cell state, therefore, both + and − waveforms are shown.

Note that it is also possible to perform a two-cycle operation including the first and third cycles, or a two-cycle operation including the second and third cycles. That is, it is also possible to check whether the cell is "1" or "0" by performing the first or second cycle alone, and then perform the third cycle for writing back the data.

The operation of reading out data from the MTJ element MTJ3 of the selected cell will be explained in detail below with reference to FIGS. 9 to 11. Note that the case where an electric current flows downward (from the recording layer to the fixed layer) through the MTJ element shown in FIG. 9 corresponds to the positive side of a waveform Ir1 shown in FIG. 10.

(Initial State)

First, as shown in FIG. 10, the initial state of the selected cell is read out (R). More specifically, an electric current Ir1-0 is supplied to the right in the chain structure, and supplied downward (from the recording layer to the fixed layer) through the MTJ element MTJ3. In this manner, a resistance value $\Omega 0$ of the initial state of the chain structure is read out (R).

(First Cycle)

In the first cycle, as shown in FIG. 10, electric currents Iw1-1 and Ir1-1 are supplied to the selected cell to perform a "0"-expected write operation (W0) and a read operation (R). While the "0"-expected write operation (W0) is performed, an electric current Iw2 is supplied to a word line corresponding to the selected cell.

More specifically, as shown in FIG. 9, the electric current Iw1-1 is supplied to the right in the chain structure, and supplied downward (from the recording layer to the fixed layer) through the MTJ element MTJ3. Spin-polarized electrons generated by the electric current Iw1-1 are allowed to act on the magnetization in the recording layer of the MTJ element MTJ3. Meanwhile, the electric current Iw2 is supplied to the word line WL3 corresponding to the MTJ element MTJ3, and a current magnetic field H generated by the electric current Iw2 is applied to the MTJ element MTJ3. In this way, the "0"-expected write operation is performed on the MTJ element MTJ3 (W0).

Then, the electric current Ir1-1 is supplied to the right in the chain structure, and supplied downward (from the recording layer to the fixed layer) through the MTJ element MTJ3. In this manner, a resistance value $\Omega 1$ of the chain structure obtained as the result of "0"-expected write is read out (R).

(Second Cycle)

In the second cycle, as shown in FIG. 10, electric currents Iw1-2 and Ir1-2 are supplied to the selected cell to perform a "1"-expected write operation (W1) and a read operation (R). While the "1"-expected write operation (W1) is performed, the electric current Iw2 is supplied to the word line corresponding to the selected cell.

More specifically, as shown in FIG. 9, the electric current Iw1-2 is supplied to the left in the chain structure, and supplied upward (from the fixed layer to the recording layer) through the MTJ element MTJ3. Spin-polarized electrons generated by the electric current Iw1-2 are allowed to act on the magnetization in the recording layer of the MTJ element MTJ3. Meanwhile, the electric current Iw2 is supplied to the word line WL3 corresponding to the MTJ element MTJ3, and a current magnetic field H generated by the electric current Iw2 is applied to the MTJ element MTJ3. In this way, the "1"-expected write operation is performed on the MTJ element MTJ3 (W1).

Then, the electric current Ir1-2 is supplied to the right in the chain structure, and supplied downward (from the recording layer to the fixed layer) through the MTJ element MTJ3. In this manner, a resistance value $\Omega 2$ of the chain structure obtained as the result of "1"-expected write is read out (R).

(Third Cycle)

In the third cycle, as shown in FIG. 10, an electric current Iw1-3 is supplied to the selected cell to perform a "0"- or "1"-expected write operation (W0/1). While this write operation (W0/1) for writing back the data is performed, the electric current Iw2 is supplied to the word line corresponding to the selected cell.

More specifically, the data in the MTJ element MTJ3 of the selected cell is first discriminated on the basis of the resistance values $\Omega 0$, $\Omega 1$, and $\Omega 2$ obtained by the read operation (R).

That is, as shown in FIG. 11, if the resistance value $\Omega 1$ as the result of "0"-expected write remains the same as and the resistance value Ω2 as the result of "1"-expected write rises from the resistance value Ω0 in the initial state, it is possible to determine that the data of the selected cell is "0". On the other hand, if the resistance value Ω1 as the result of "0"-expected write decreases from and the resistance value Ω2 as the result of "1"-expected write remains the same as the resistance value Ω0 in the initial state, it is possible to determine that the data of the selected cell is "1".

In this embodiment, assume that the data of the selected cell is "0." To perform "0"-expected write, therefore, as shown in FIG. 9, the electric current Iw1-3 is supplied to the right in the chain structures and supplied downward (from the recording layer to the fixed layer) through the MTJ element MTJ3. Spin-polarized electrons generated by the electric current Iw1-3 are allowed to act on the magnetization in the recording layer of the MTJ element MTJ3. Meanwhile, the electric current Iw2 is supplied to the word line WL3 corresponding to the MTJ element MTJ3, and a current magnetic field H generated by the electric current Iw2 is applied to the MTJ element MTJ3. In this way, the "0"-expected write operation is performed on the MTJ element MTJ3, thereby writing back the data of the initial state.

Note that during the read operation, the voltage of the bit line is desirably about 0.4 V. The electric currents Ir1-1, Ir1-2, and Ir1-3 to be supplied to the chain structure are about 3 μA, and it is desirable to take a sufficient margin so as not to cause any reversal error. The current values of the electric currents Ir1-0, Ir1-1, and Ir1-2 are desirably smaller than those of the electric currents Iw1-1, Iw1-2, and Iw1-3. The current values of the electric currents Iw1-1, Iw1-2, and Iw1-3 are equivalent to, e.g., that of the write current Iw1 explained with reference to FIGS. 6 and 7.

[1-5] MTJ Element (Structure)

Figure 12A:
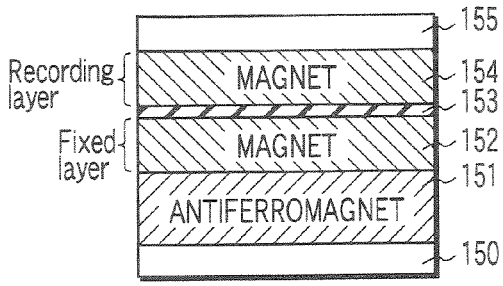
FIGS. 12A to 12E are sectional views showing MTJ elements according to the first embodiment of the present invention.

FIG. 12A is a sectional view showing the first example of the MTJ element MTJ according to the first embodiment of the present invention. The MTJ element MTJ according to the first example is an MTJ element MTJ called a single-junction type element. The first example of the MTJ element will be explained below.

As shown in FIG. 12A, an antiferromagnetic layer 151, ferromagnetic layer 152, tunnel barrier layer 153, ferromagnetic layer 154, and protective layer 155 are sequentially formed on an undercoat 150.

In this embodiment, the ferromagnetic layer 152 functions as a fixed layer (pinned layer) in which the magnetization direction is fixed, and the ferromagnetic layer 154 functions as a recording layer (free layer) in which the magnetization direction reverses. The antiferromagnetic layer 151 fixes the magnetization direction in the ferromagnetic layer 152. The magnetization direction in the ferromagnetic layer 152 functioning as a fixed layer may also be fixed by using, e.g., the antiferromagnetic layer 151.

Note that the undercoat 150 is a layer for facilitating the formation of, e.g., the ferromagnetic layers and antiferromagnetic layer and protecting these layers, and is formed if necessary. The protective layer 155 is a layer for protecting, e.g., the ferromagnetic layers and antiferromagnetic layer, and is formed if necessary similar to the undercoat 150. The protective layer 155 may also be formed by using a hard mask layer or the like. These features of the undercoat 150 and protective layer 155 similarly apply to the second to fourth examples explained below.

Figure 12D:
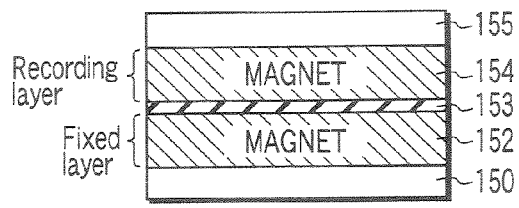
Figure 12B:
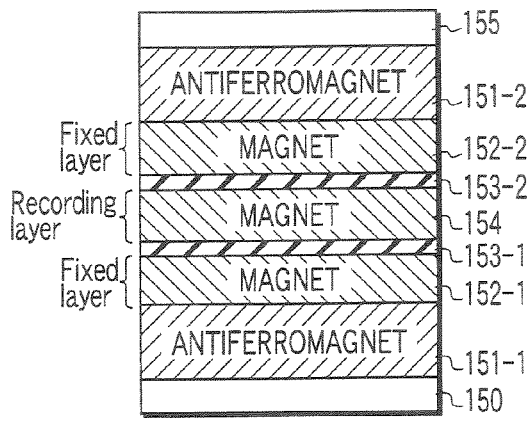

FIG. 12B is a sectional view showing the second example of the MTJ element MTJ according to the first embodiment of the present invention. The MTJ element MTJ according to the second example is an MTJ element MTJ called a double-junction type element. The second example of the MTJ element will be explained below.

As shown in FIG. 12B, an antiferromagnetic layer 151-1, ferromagnetic layer 152-1, tunnel barrier layer 153-1, ferromagnetic layer 154, tunnel barrier layer 153-2, ferromagnetic layer 152-2, antiferromagnetic layer 151-2, and protective layer 155 are sequentially formed on an undercoat 150.

In this example, the ferromagnetic layers 152-1 and 152-2 function as fixed layers, and the ferromagnetic layer 154 functions as a recording layer. The antiferromagnetic layer 151-1 fixes the magnetization direction in the ferromagnetic layer 152-1. The antiferromagnetic layer 151-2 fixes the magnetization direction in the ferromagnetic layer 152-2.

Compared to the single-junction type MTJ element MTJ shown in FIG. 12A, for example, the double-junction type MTJ element MTJ of this example has the advantage that it can further increase the ratio of the resistance value in a low-resistance state to that in a high-resistance state, i.e., a so-called MR (Magneto-Resistance) ratio.

Note that each of the fixed layer and recording layer may also have a structure including two ferromagnetic layers with a nonmagnetic layer sandwiched between them such as a ferromagnetic layer/nonmagnetic layer/ferromagnetic layer, a structure including three ferromagnetic layers such as a ferromagnetic layer/nonmagnetic layer/ferromagnetic layer/nonmagnetic layer/ferromagnetic layer, or an extended structure including more ferromagnetic layers. In the spin injection type double-junction structure, however, one of the ferromagnetic layers 152-1 and 152-2 desirably has a multilayered structure including odd-numbered ferromagnetic layers, and the other desirably has a multilayered structure including even-numbered ferromagnetic layers. For example, the ferromagnetic layer 152-1 has a structure including two ferromagnetic layers, and the ferromagnetic layer 152-2 has a structure including three ferromagnetic layers.

Figure 12E:
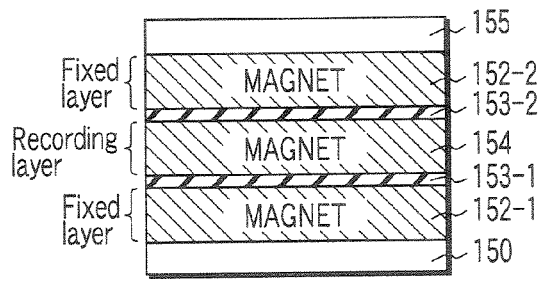
Figure 12C:
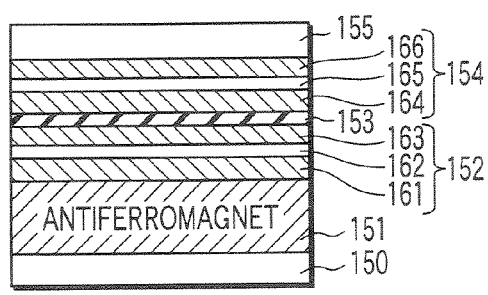

FIG. 12C is a sectional view showing the third example of the MTJ element MTJ according to the first embodiment of the present invention. In the MTJ element MTJ according to the third example, each of the ferromagnetic layers 152 and 154 of the MTJ element MTJ according to the first example has a stacked structure including ferromagnetic layers and a nonmagnetic layer. The third example of the MTJ element will be explained below.

As shown in FIG. 12C, an example of the stacked structure of the MTJ element MTJ according to the third example is a three-layered film including a ferromagnetic layer/nonmagnetic layer/ferromagnetic layer. In this example, the ferromagnetic layer 152 is a three-layered film including a ferromagnetic layer 161/nonmagnetic layer 162/ferromagnetic layer 163, and the ferromagnetic layer 154 is a three-layered film including a ferromagnetic layer 164/nonmagnetic layer 165/ferromagnetic layer 166.

When the ferromagnetic layer 152 functioning as a fixed layer is given the stacked structure, e.g., the three-layered film including the ferromagnetic layer 161/nonmagnetic layer 162/ferromagnetic layer 163, antiferromagnetic coupling is preferably generated between the ferromagnetic layers 161 and 163 via the nonmagnetic layer 162. In addition, an antiferromagnetic layer 151 is formed in contact with this three-layered film. With this structure, it is possible to obtain the advantage that the magnetization direction in the ferromagnetic layer 152 functioning as a fixed layer, particularly, the magnetization direction in the ferromagnetic layer 163 can be fixed more strongly. This advantage makes the ferromagnetic layer 152, particularly, the ferromagnetic layer 163 hardly suffer the influence of a current magnetic field. Accordingly, it is possible to suppress unexpected reversal of the magnetization direction in the ferromagnetic layer 152 functioning as a fixed layer.

Likewise, even when the ferromagnetic layer 154 functioning as a recording layer is given the stacked structure, e.g., the three-layered film including the ferromagnetic layer 164/nonmagnetic layer 165/ferromagnetic layer 166, antiferromagnetic coupling is preferably generated between the ferromagnetic layers 164 and 166 via the nonmagnetic layer 165. In this case, the increase in switching magnetic field caused by the magnetic pole or the like can be suppressed because the magnetic flux closes itself within the three-layered film. Consequently, it is possible to obtain the advantage that even when the size of a memory cell, the MTJ element MTJ, or the like becomes submicron or less, the increase in power consumption caused by, e.g., a current magnetic field generated by a demagnetizing field can be suppressed.

Also, the ferromagnetic layer 154 functioning as a recording layer may also have a stacked structure including a soft ferromagnetic layer and ferromagnetic layer. The soft ferromagnetic layer herein mentioned is a layer in which the magnetization direction reverses more easily than in a ferromagnetic layer or the like.

When the ferromagnetic layer 154 is given the stacked structure including the soft ferromagnetic layer and ferromagnetic layer, the soft ferromagnetic layer is placed near a current magnetic field line, e.g., a bit line.

This stacked structure can further include a nonmagnetic layer. When the stacked structure is the three-layered film including the ferromagnetic layer 164/nonmagnetic layer 165/ferromagnetic layer 166 as in this example, the ferromagnetic layer 166, for example, may also be the soft ferromagnetic layer.

In this example, each of the ferromagnetic layers 152 and 154 is given the stacked structure. However, the stacked structure may also be given to only one of the ferromagnetic layers 152 and 154.

FIGS. 12D and 12E are sectional views showing the fourth example of the MTJ element MTJ according to the first embodiment of the present invention. The MTJ element MTJ according to the fourth example is an example of a holding force difference type structure obtained by omitting the antiferromagnetic layer 151 of the MTJ element MTJ according to each of the first and second examples. The fourth example of the MTJ element will be explained below.

As shown in FIGS. 12D and 12E, no antiferromagnetic layer 151 is formed adjacent to a ferromagnetic layer 152 functioning as a fixed layer. In this structure, the holding force of the ferromagnetic layer 152 functioning as a fixed layer is made much larger than that of a ferromagnetic layer 154 functioning as a recording layer.

Note that in FIGS. 12A to 12E, "MAGNET" includes both "FERROMAGNET" and "FERRIMAGNET".

(Planar Shape)

The planar shape of the MTJ element MTJ can be changed to, e.g., a rectangle, ellipse, circle, hexagon, rhomb, parallelogram, cross, or bean (recessed shape).

The fixed layer, nonmagnetic layer, and recording layer of the MTJ element MTJ are simultaneously processed to have the same planar shape, but the present invention is not limited to this structure. For example, it is also possible to give a square shape to the fixed layer and nonmagnetic layer, and a cross shape to the recording layer alone.

(Materials)

The following ferromagnetic materials are used as the materials of the fixed layer and recording layer. That is, it is favorable use any of Fe, Co, Ni, stacked films and alloys of these metals, magnetite having a high spin polarization, oxides such as $CrO_2$ and $RXMnO_{3-Y}$ (R; a rare earth element, and X; Ca, Ba, or Sr), and Heusler alloys such as NiMnSb and PtMnSb. These magnetic materials may also contain more or less nonmagnetic elements such as Ag, Cu, Au, Al, Mg, Si, Bi, Ta, B, C, O, N, Pd, Pt, Zr, Ir, W, Mo, and Nb.

As the material of the nonmagnetic layer, it is possible to use various dielectric materials such as $Al_2O_3$, $SiO_2$, MgO, AlN, $Bi_2O_3$, $MgF_2$, $CaF_2$, $SrTiO_2$, and $AlLaO_3$. Oxygen, nitrogen, and fluorine deficiencies may exist in these dielectric materials.

When an insulator such as MgO (magnesium oxide) or AlO (aluminum oxide, e.g., $Al_2O_3$) is used as the nonmagnetic layer, the MTJ element MTJ has the TMR (Tunneling Magneto Resistive) effect. When a metal such as Cu or Pt is used as the nonmagnetic layer, the MTJ element MTJ has the GMR (Giant Magneto Resistive) effect.

(Magnetization Arrangement)

FIGS. 13A, 13B, 14A, and 14B are views showing the parallel or antiparallel magnetization arrangement in the MTJ element according to the first embodiment of the present invention.

Figure 13A:
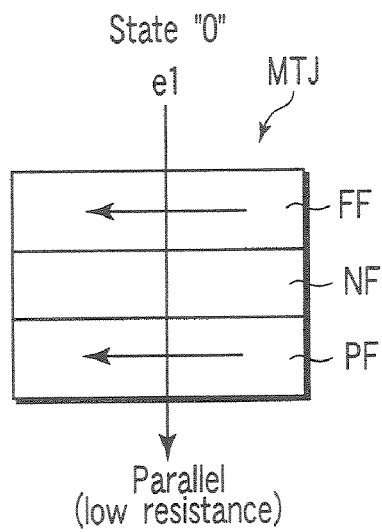
FIG. 13A is a view showing the parallel arrangement of a planar magnetization type MTJ element according to each embodiment of the present invention.
Figure 14A:
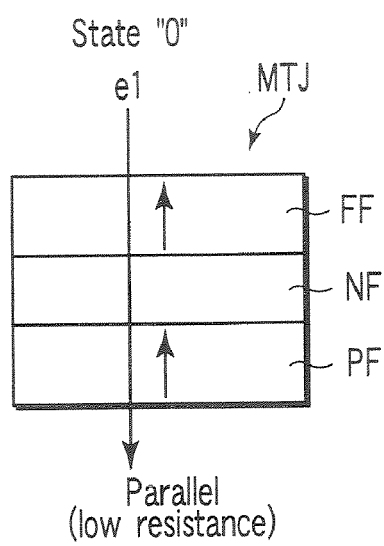
FIG. 14A is a view showing the parallel arrangement of a perpendicular magnetization type MTJ element according to each embodiment of the present invention.

As shown in FIGS. 13A and 14A, when the magnetization directions in the fixed layer and recording layer of the MTJ element MTJ are parallel (equal), the tunnel resistance of the nonmagnetic layer is lowest. This state is, e.g., a state "0".

Figure 13B:
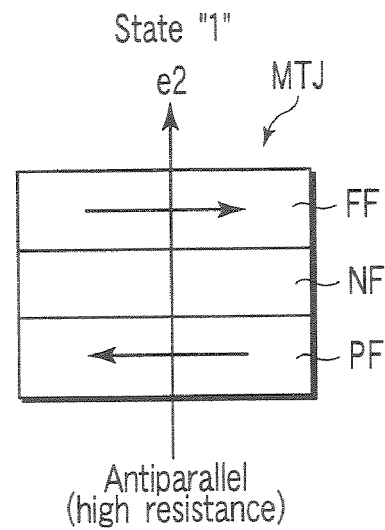
FIG. 13B is a view showing the antiparallel arrangement of the parallel magnetization type MTJ element according to each embodiment of the present invention.
Figure 14B:
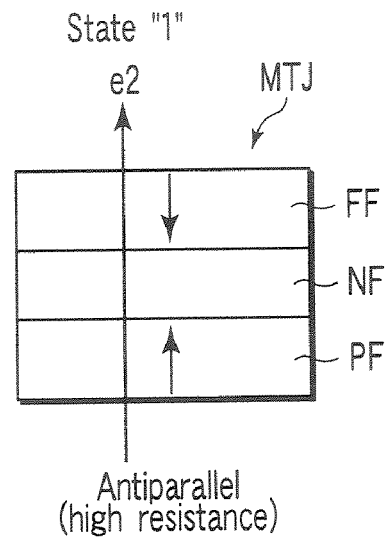
FIG. 14B is a view showing the antiparallel arrangement of the perpendicular magnetization type MTJ element according to each embodiment of the present invention.

On the other hand, as shown in FIGS. 13B and 14B, when the magnetization directions in the fixed layer and recording layer of the MTJ element MTJ are antiparallel (opposite), the tunnel resistance of the nonmagnetic layer is highest. This state is, e.g., a state "1".

Note that the type of the magnetization stabilizing direction in the fixed layer and recording layer can be a parallel magnetization type in which magnetization stabilizes in the direction parallel to the film surface as shown in FIGS. 13A and 13B, or a perpendicular magnetization type in which magnetization stabilizes in the direction perpendicular to the film surface as shown in FIGS. 14A and 14B.

When using shape magnetic anisotropy in a parallel magnetization type MTJ element MTJ, the direction (long-side direction) of the easy magnetization axis of the MTJ element is the direction in which the bit line BL runs, and the direction (short-side direction) of the hard magnetization axis of the MTJ element is the direction in which the word line WL runs.

[1-6] Effects

The first embodiment described above gives the chain structure to MTJ elements, and allows selective write to a 1-bit MTJ element. Since this reduces the size of a transistor necessary for the operation of the MTJ element, the cell density can be increased.

[2] Second Embodiment

The second embodiment is an example in which a contact is additionally formed between the MTJ element and bit line of the first embodiment.

[2-1] Structure of Magnetic Random Access Memory

Figure 15:
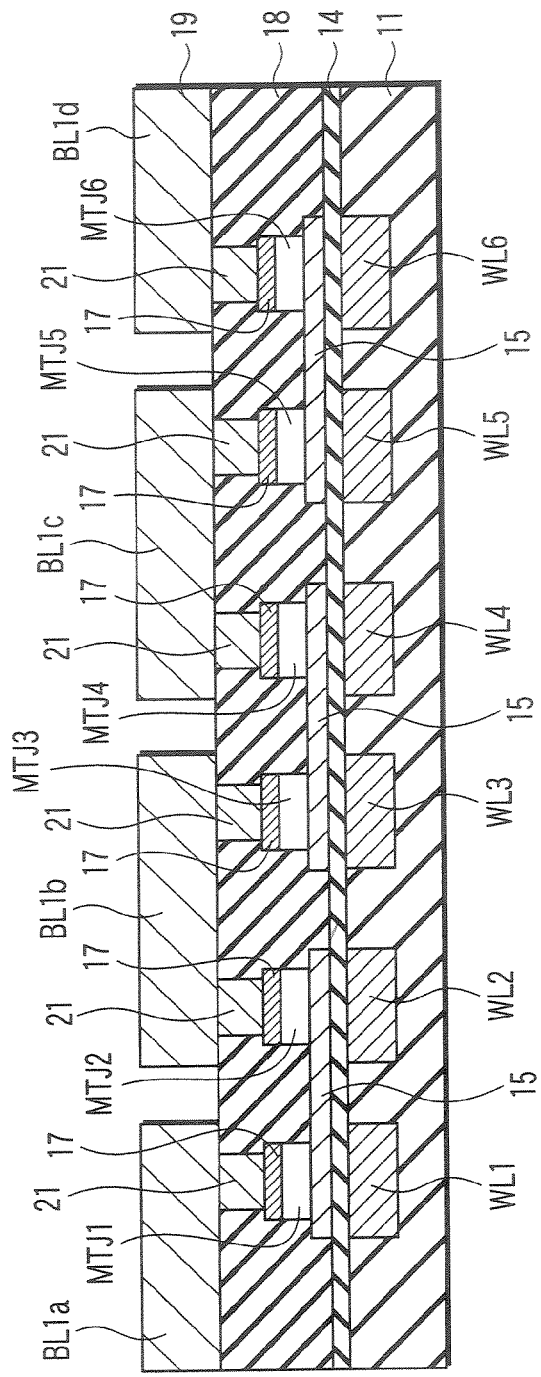
FIG. 15 is a sectional view showing a magnetic random access memory according to the second embodiment of the present invention.

FIG. 15 is a sectional view of a magnetic random access memory according to the second embodiment of the present invention. The structure of the magnetic random access memory according to the second embodiment will be explained below.

As shown in FIG. 15, the second embodiment differs from the first embodiment in that contact layers 21 are formed between MTJ elements MTJ1 to MTJ6 and bit lines BL1a to BL1d.

That is, in the first embodiment, the contact layers 17 on the MTJ elements MTJ1 to MTJ6 are directly connected to the bit lines BL1a to BL1d. In the second embodiment, however, contact layers 17 on the MTJ elements MTJ1 to MTJ6 are not directly connected to the bit lines BL1a to BL1d, but connected to them via the contact layers 21.

As shown in FIG. 15, the contact layers 21 may have an area different from that of the MTJ elements MTJ1 to MTJ6. For example, the planar shape of the contact layer 21 is smaller than that of the contact layer 17 of each of the MTJ elements MTJ1 to MTJ6.

This structure is obtained as follows. After contact layers 17 are formed in the same manner as in the first embodiment, an insulating film is deposited on the contact layers 17, and this insulating film is partially removed by using lithography and the processing technique, thereby forming contract holes that expose the contact layers 17. Then, contact layers 21 are formed by burying a conductive material in these contact holes.

Note that the write and read operations of the second embodiment are the same as in the first embodiment, so a repetitive explanation will be omitted.

[2-2] Effects

The second embodiment described above can achieve the same effects as in the first embodiment, and can also achieve the following effect.

In the first embodiment, when planarizing the insulating film 18 deposited on the MTJ elements MTJ by CMP, the film thickness may vary during this CMP. In the second embodiment, however, the bit lines BL and the contact layers 17 on the MTJ elements MTJ are not directly connected, and the contact layers 21 are formed between them. Therefore, the contact layers 21 can absorb the film thickness variation in the first embodiment. Since this makes MRAM integration having a large process margin possible, the yield can be increased.

[3] Third Embodiment

In the third embodiment, the thermal assisting effect is obtained in a write operation by adding a heater layer on a word line in the first embodiment.

[3-1] Structure of Magnetic Random Access Memory

Figure 16:
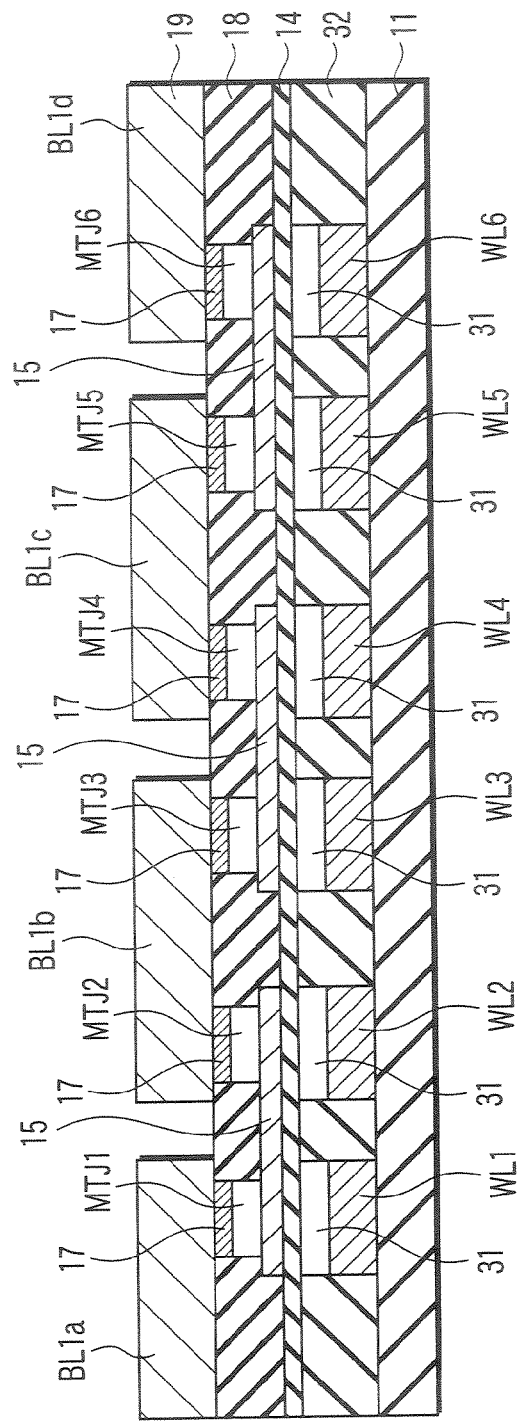
FIG. 16 is a sectional view showing a magnetic random access memory according to the third embodiment of the present invention.

FIG. 16 is a sectional view of a magnetic random access memory according to the third embodiment of the present invention. The structure of the magnetic random access memory according to the third embodiment will be explained below.

As shown in FIG. 16, the third embodiment differs from the first embodiment in that heater layers 31 are formed on word lines WL1 to WL6.

The heater layers 31 are stacked on and integrated with the word lines WL1 to WL6, and in contact with the word lines WL1 to WL6. An insulating liner film 14 is formed between the heater layers 31 and lower electrodes 15, thereby insulating the heater layers 31 from the lower electrodes 15. Note that if the heater layers 31 have insulating properties, they may also be brought into contact with the lower electrodes 15.

The heater layers 31 are heated by supplying an electric current to the word lines WL1 to WL6. Examples of the material of the heater layers 31 are as follows. An optimum material is selected from these materials in accordance with the necessary heating temperature or process integration.

(a) An Ni—Cr-based alloy, an Ni—Cr—Fe-based alloy, or an alloy obtained by adding a small amount of Si to one of these alloys (b) A Cu—Ni-based alloy or Cu—Ni—Zn—W-based alloy (c) W, W—Th oxide, or a W-based alloy such as W—Mo or W—Re (d) Ta or a Ta-based alloy such as Ta—W—Hf (e) A Ti—Al-oxide alloy The liner film 14 is desirably made of an insulating material having high thermal conductivity in order to efficiently conduct the heat of the heated heater layers 31 to the MTJ elements MTJ1 to MTJ6, and having high congeniality to the process. Examples of the material are $SiO_2$, SIN, and $AlO_x$.

[3-2] Method of Fabricating Magnetic Random Access Memory

FIGS. 17 to 21 are sectional views showing fabrication steps of the magnetic random access memory according to the third embodiment of the present invention. A method of fabricating the magnetic random access memory according to the third embodiment will be explained below.

Figure 17:
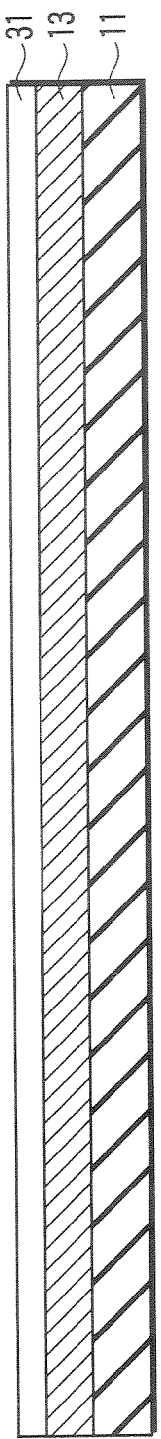
FIGS. 17 to 21 are sectional views showing fabrication steps of the magnetic random access memory according to the third embodiment of the present invention.

First, as shown in FIG. 17, an insulating film 11 is formed on a semiconductor substrate (not shown) having CMOS circuits, multilayered interconnections, and the like. Then, a barrier metal film (not shown) made of, e.g., Ti or TiN and a low-resistance metal material 13 such as AlCu are stacked on the insulating film 11. In addition, a heater layer 31 is stacked on the metal material 13.

Figure 18:
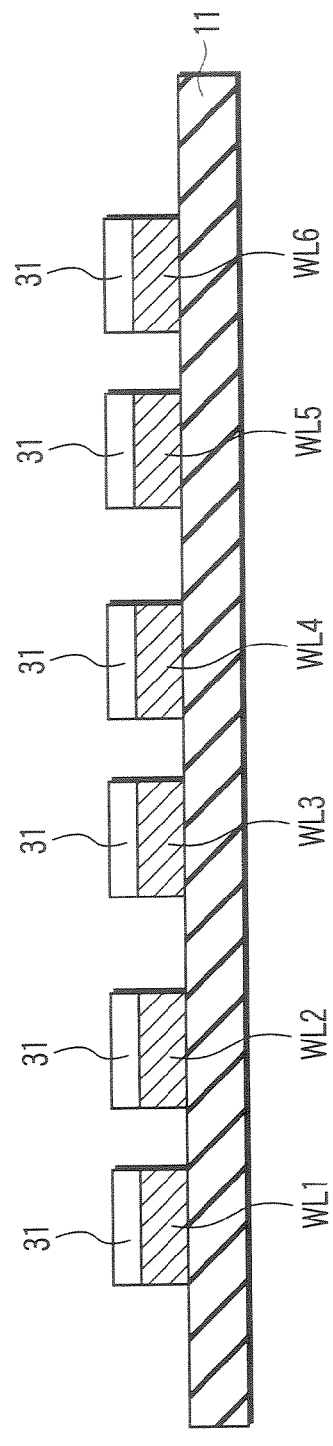

Subsequently, as shown in FIG. 18, the metal material 13 and heater layer 31 are simultaneously processed by using, e.g., RIE and ion milling. In this manner, word lines WL1 to WL6 are formed.

Figure 19:
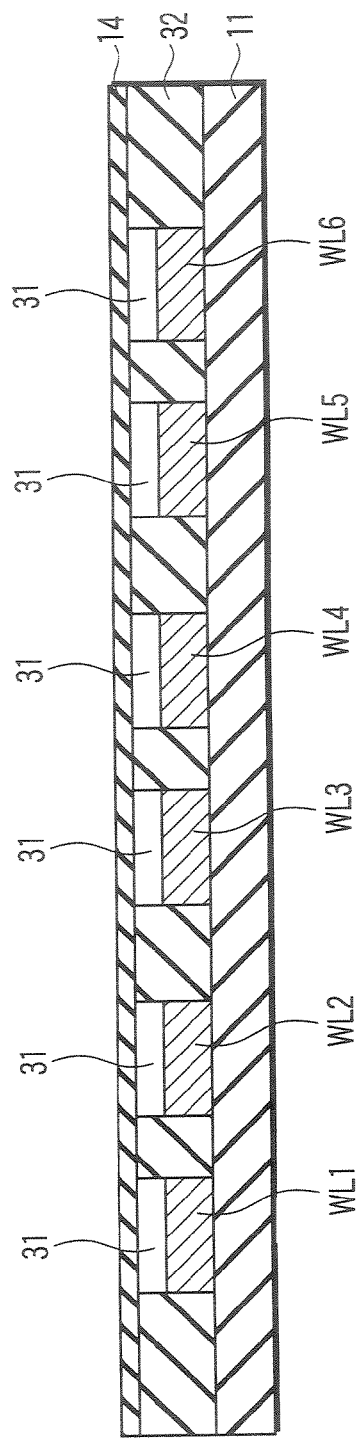

As shown in FIG. 19, an insulating film 32 is deposited on the entire surface, and planarized until the heater layers 31 are exposed. An insulating liner film 14 made of, e.g., SiN and serving as an etching stopper and insulating isolation film is formed on the heater layers 31 and insulating film 32.

Figure 20:
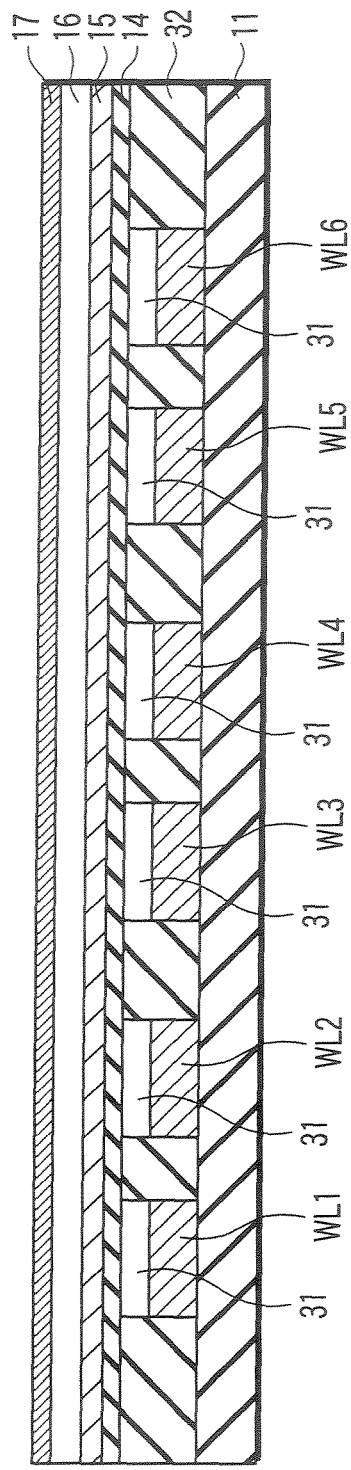

As shown in FIG. 20, a lower electrode 15, MTJ film 16, and upper contact layer 17 are stacked on the liner film 14.

Figure 21:
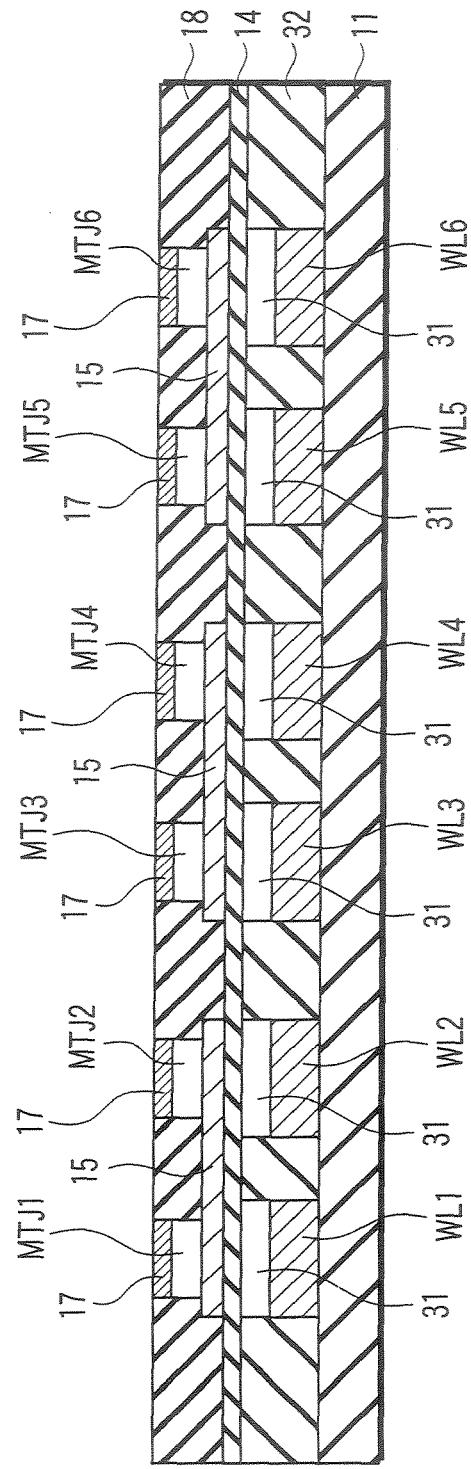

As shown in FIG. 21, the upper contact layer 17 and MTJ film 16 are simultaneously processed by, e.g., RIE and ion milling by using the lower electrode 15 as a stopper. In this way, MTJ elements MTJ are separated into cells. Then, the lower electrode 15 is processed into a predetermined shape. After that, the HDP method or the like is used to bury an $SiO_x$-based insulating film 18. The insulating film 18 is planarized by CMP to expose the contact layers 17.

Subsequently, as shown in FIG. 16, a barrier metal film (not shown) made of, e.g., Ti or TiN and an interconnection material 19 such as AlCu are stacked. The interconnection material 19 is processed by using conventional lithography and RIE, thereby forming bit lines BL. Finally, a memory cell portion is completed by forming a passivation film (not shown).

[3-3] Write Method

The write operation of the third embodiment is basically the same as the first embodiment. That is, when writing data in a selected cell, a write current Iw1 is supplied to the chain structure, and spin-polarized electrons generated by the write current Iw1 are allowed to act on the magnetization in the recording layer of the selected cell. In this state, an electric current Iw2 is supplied to a word line WL corresponding to the selected cell, and a current magnetic field H generated by the electric current Iw2 is applied to the MTJ element of the selected cell. Accordingly, the spin-polarized electrons generated by the electric current Iw1 and the current magnetic field H generated by the electric current Iw2 are acting on the selected cell.

Consequently, a magnetization reversal threshold value Ic obtained by spin injection reduces due to the influence of the current magnetic field H in only the MTJ element MTJ immediately above the word line WL where the current magnetic field H is generated. Therefore, the electric current Iw1 flowing through the chain structure causes magnetization reversal in only the selected MTJ element MTJ.

In the third embodiment, the heater layer 31 stacked on the word line WL is heated by supplying the write current Iw2 to the word line WL. The conduction of the heat of the heater layer 31 heats the MTJ element MTJ above the heater layer 31. When the write current Iw1 for magnetization reversal in the MTJ element MTJ is supplied to the chain structure in this state, the write current Iw1 selectively causes magnetization reversal in only the MTJ element MTJ immediately above the word line WL to which the write current Iw2 is supplied, because the magnetization reversal threshold value Ic obtained by spin injection has reduced due to the influence of heat in only this MTJ element.

The following three examples shown in FIGS. 7A to 7C are possible as the supply timings of the write currents Iw1 and Iw2 in the case of thermal assist as described above as well. In this embodiment, the write current Iw1 is supplied to the chain structure after the current magnetic field H is changed by heating the element by supplying the write current Iw2. Therefore, the timing shown in FIG. 7A is mainly used. However, the timings shown in FIGS. 7B and 7C are also possible due to the influence of the timing (e.g., delay) of circuit operation stabilization or the like.

Note that the read operation of the third embodiment is the same as that of the first embodiment, so a repetitive explanation will be omitted.

[3-4] Effects

The third embodiment described above can achieve the same effects as in the first embodiment. In addition, the heater layers 31 are formed on the word lines WL in the third embodiment. During the write operation, therefore, thermal assist by the heater layer 31 occurs in addition to the assist by the current magnetic field H generated by the write current Iw2 of the word line WL. This makes it possible to further reduce the magnetization reversal threshold value Ic necessary for spin injection reversal. Since this increases the design margin of the MTJ film, the reliability of the MTJ film can improve.

[4] Fourth Embodiment

The fourth embodiment is an example in which the chain structure according to the first embodiment is a ladder structure.

[4-1] Structure of Magnetic Random Access Memory

Figure 22:
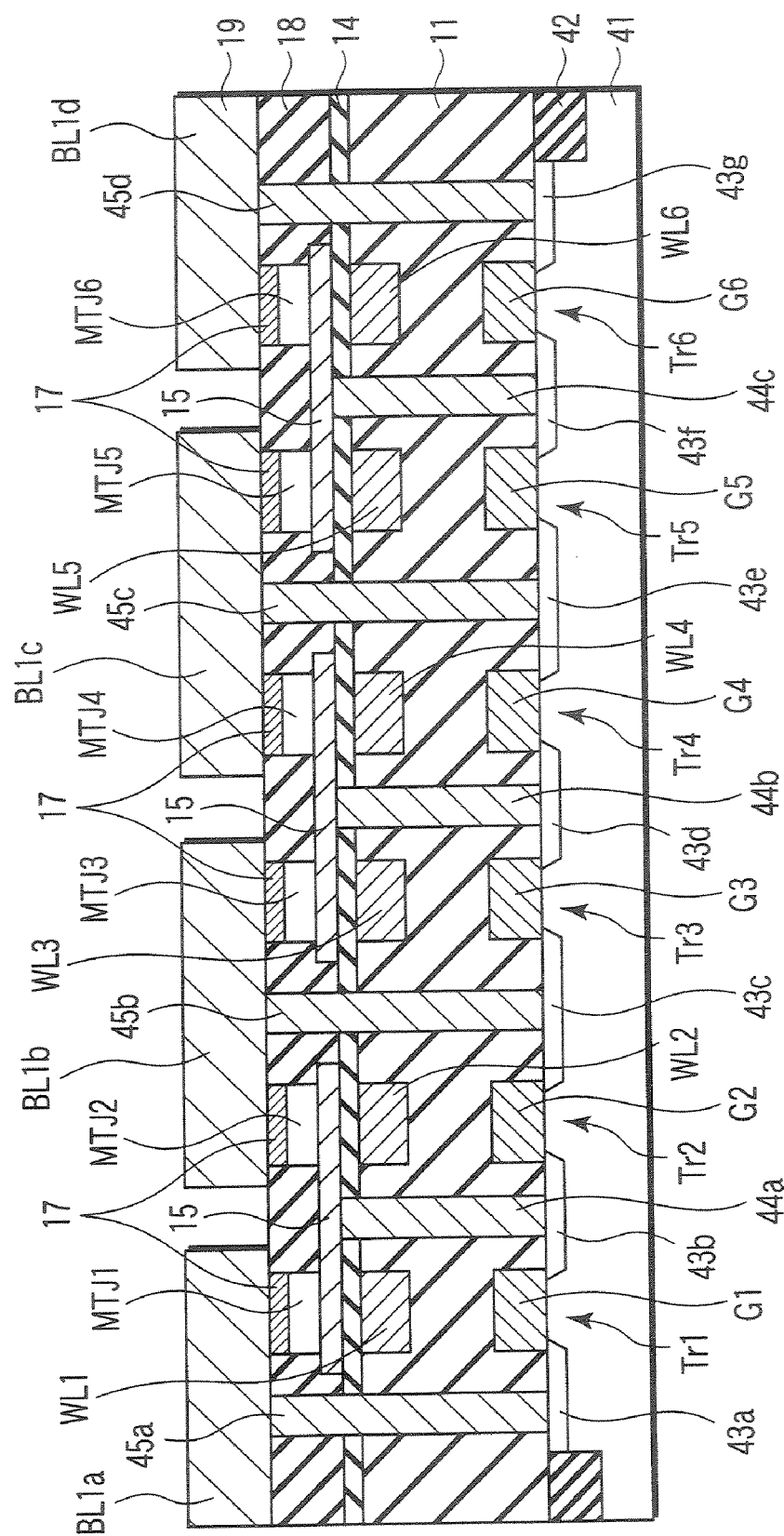
FIG. 22 is a sectional view showing a magnetic random access memory according to the fourth embodiment of the present invention.

FIG. 22 is a sectional view of the magnetic random access memory according to the fourth embodiment of the present invention. The structure of the magnetic random access memory according to the fourth embodiment will be explained below.

As shown in FIG. 22, the fourth embodiment differs from the first embodiment in that a transistor (e.g., a MOSFET) is formed for each MTJ element, and MTJ elements and their respective corresponding transistors are connected in parallel to form a ladder chain structure.

More specifically, transistors Tr1 to Tr6 are formed at the same interval as that of MTJ elements MTJ1 to MTJ6 in the lower portion of the chain structure. Gate electrodes G1 to G6 of the transistors Tr1 to Tr6 are respectively formed immediately below the MTJ elements MTJ1 to MTJ6 (word lines WL1 to WL6). The transistor Tr1 has the gate electrode G1 and source/drain diffusion layers 43a and 43b. The transistor Tr2 has the gate electrode G2, the source/drain diffusion layer 43b, and a source/drain diffusion layer 43c. The transistor Tr3 has the gate electrode G3, the source/drain diffusion layer 43c, and a source/drain diffusion layer 43d. The transistor Tr4 has the gate electrode G4, the source/drain diffusion layer 43d, and a source/drain diffusion layer 43e. The transistor Tr5 has the gate electrode G5, the source/drain diffusion layer 43e, and a source/drain diffusion layer 43f. The transistor Tr6 has the gate electrode G6, the source/drain diffusion layer 43f, and a source/drain diffusion layer 43g. Accordingly, the transistors Tr1 and Tr2 share the source/drain diffusion layer 43b, the transistors Tr2 and Tr3 share the source/drain diffusion layer 43c, the transistors Tr3 and Tr4 share the source/drain diffusion layer 43d, the transistors Tr4 and Tr5 share the source/drain diffusion layer 43e, and the transistors Tr5 and Tr6 share the source/drain diffusion layer 43f.

A contact 45a connects the source/drain diffusion layer 43a and a bit line BL1a. A contact 44a connects the source/drain diffusion layer 43b and a lower electrode 15. In this manner, the MTJ element MTJ1 and the two ends (source and drain) of the current path of the transistor Tr1 are connected in parallel. That is, the MTJ elements MTJ1 to MTJ6 and the corresponding transistors Tr1 to Tr6 are connected in parallel in the individual cells. Also, each cell is connected in series with an adjacent cell. As described above, the chain structure of the fourth embodiment is a ladder structure.

[4-2] Method of Fabricating Magnetic Random Access Memory

FIGS. 23 to 26 are sectional views showing a method of fabricating the magnetic random access memory according to the fourth embodiment of the present invention. The method of fabricating the magnetic random access memory according to the fourth embodiment will be explained below.

First, as shown in FIG. 23, an element isolation region 42 having an STI (Shallow Trench Isolation) structure is formed in a semiconductor substrate 41. Then, gate electrodes G1 to G6 are formed on the semiconductor substrate 41, and source/drain diffusion layers 43a to 43g are formed on the two sides of the gate electrodes G1 to G6. In this way, transistors Tr1 to Tr6 such as MOSFETs are formed.

Subsequently, an insulating film 11 is formed on the semiconductor substrate 41, and trenches 12 are formed in the insulating film 11. A barrier metal film (not shown) made of, e.g., Ta or TaN is formed, and a metal material 13 made of, e.g., Cu is formed on this barrier metal film by plating. The metal material 13 is planarized by CMP and buried in the trenches 12. In this manner, word lines WL1 to WL6 made of the metal material 13 are formed in the trenches 12.

An anti-oxidizing liner film 14 made of SiN or the like is formed on the word lines WL1 to W16 and insulating film 11. Then, contact holes reaching the source/drain diffusion layers 43a to 43g are formed. A barrier metal film (not shown) made of Ti is formed in the contact holes. A metal material made of W is formed on this barrier metal film and buried in the contact holes by CVD, thereby forming contacts 44a to 44c.

Next, as shown in FIG. 24, a lower electrode 15, MTJ film 16, and contact layer 17 are stacked on the liner film 14 and contacts 44a to 44c.

Figure 25:
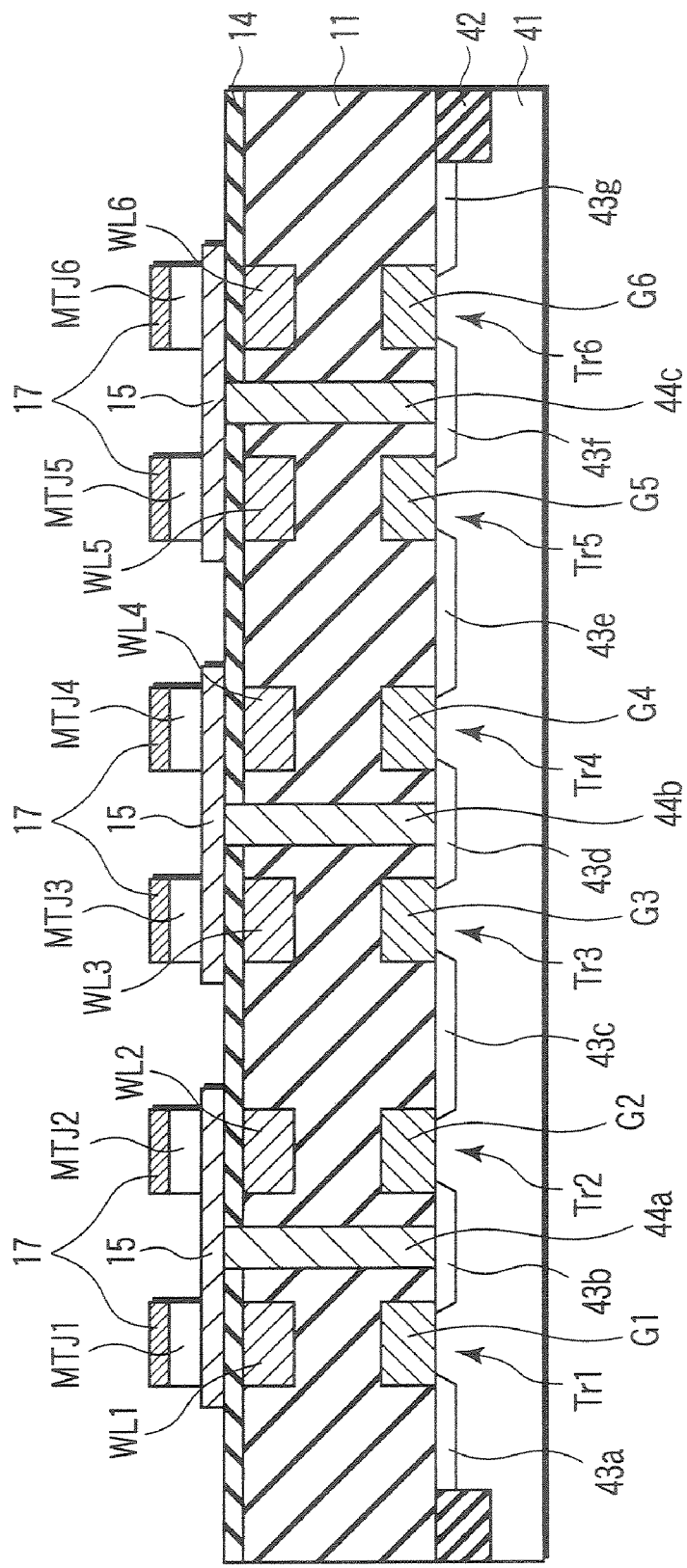

As shown in FIG. 25, the contact layer 17 and MTJ film 16 are simultaneously processed by, e.g., RIE and ion milling by using the lower electrode 15 as a stopper. In this manner, MTJ elements MTJ1 to MTJ6 are separated into cells. Subsequently, the lower electrode 15 is processed into a predetermined shape.

As shown in FIG. 26, an $SiO_x$-based insulating film 18 is buried by the HDP method or the like. The insulating film 18 is then planarized by CMP to expose the contact layers 17. After that, contact holes reaching the source/drain diffusion layers 43a to 43g are formed. A barrier metal film (not shown) made of Ti is formed in these contact holes. A metal material made of W is formed on this barrier metal film and buried in the contact holes by CVD or the like, thereby forming contacts 45a to 45d.

Subsequently, as shown in FIG. 22, a barrier metal film (not shown) made of, e.g., Ti or TiN and an interconnection material 19 such as AlCu are stacked. After that, the interconnection material 19 is processed by conventional lithography and RIE, thereby forming bit lines BL1a to BL1d. Finally, a memory cell portion is completed by forming a passivation film (not shown).

[4-3] Write Method

Figure 27:
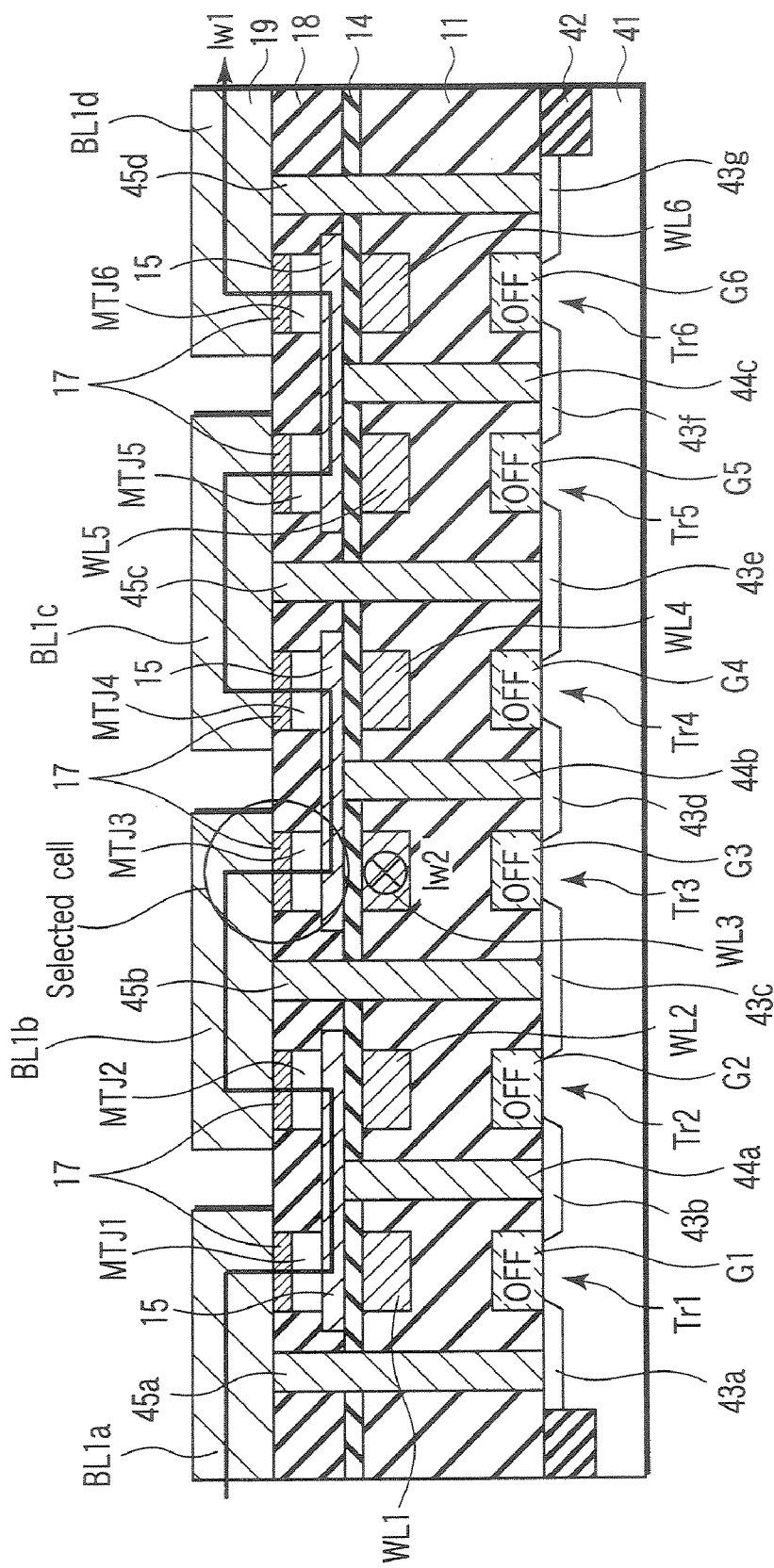
FIG. 27 is a view for explaining the write operation of the magnetic random access memory according to the fourth embodiment of the present invention.

FIG. 27 shows the write operation of the magnetic random access memory according to the fourth embodiment of the present invention. The write operation of the magnetic random access memory according to the fourth embodiment will be explained below.

The write operation of the fourth embodiment is basically the same as that of the first embodiment. That is, as shown in FIG. 27, when writing data in the MTJ element MTJ3 of a selected cell, a write current Iw1 is supplied to the chain structure, and spin-polarized electrons generated by the write current Iw1 are allowed to act on the magnetization in the recording layer of the MTJ element MTJ3. In this state, an electric current Iw2 is supplied to the word line WL3 corresponding to the MTJ element MTJ3, and a current magnetic field H generated by the electric current Iw2 is applied to the MTJ element MTJ3. Accordingly, the spin-polarized electrons generated by the electric current Iw1 and the current magnetic field H generated by the electric current Iw2 are acting on the MTJ element MTJ3 of the selected cell.

Consequently, a magnetization reversal threshold value Ic obtained by spin injection reduces due to the influence of the current magnetic field H in only the MTJ element MTJ3 immediately above the word line WL3 where the current magnetic field H is generated. Accordingly, the electric current Iw1 flowing through the chain structure selectively causes magnetization reversal only in the MTJ element MTJ3.

Note that in the fourth embodiment, all the transistors Tr1 to Tr6 are kept OFF during the write operation.

[4-4] Read Method

FIG. 28 is a view for explaining the read operation of the magnetic random access memory according to the fourth embodiment of the present invention. The read operation of the magnetic random access memory according to the fourth embodiment will be explained below.

The read operation of the fourth embodiment is basically the same as that of the first embodiment. In the fourth embodiment, as shown in FIG. 28, only the gate of the transistor Tr3 positioned below the MTJ element MTJ3 is turned off, and the gates of all the other transistors Tr1, Tr2, and Tr4 to Tr6 in the same chain structure are turned on. Since this divides the resistance, a read current Ir mainly flows through the channel of the transistor in each of the MTJ elements MTJ1, MTJ2, and MTJ4 to MTJ6 except for the MTJ element MTJ3; the read current Ir flows through the MTJ element itself in only the MTJ element MTJ3. As a consequence, the cell current Ir can be read out without deteriorating the signal of the MTJ element.

Note that the resistance of the transistors Tr1 to Tr6 is desirably low. This is so because the lower the resistance of the transistors Tr1 to Tr6, the higher the S/N ratio of the cell signal. As an example, the resistance of the transistors Tr1 to Tr6 is desirably lower than that of the MTJ elements MTJ1 to MTJ6.

[4-5] Effects

The fourth embodiment described above can achieve the same effects as in the first embodiment. In addition, the ladder chain structure is formed by forming the transistor Tr for each cell in the fourth embodiment. Accordingly, the flow path of the write current of the MTJ element can be stopped inside the chain structure, so the channel of the transistor need only allow the read current as a lower electric current to flow. This makes it possible to reduce the cell array area. Also, the write operation can be performed by an electric current flowing through the chain structure alone. As a consequence, the speed of the write operation can be increased.

[5] Fifth Embodiment

The fifth embodiment is a modification of the fourth embodiment, in which heater layers are formed on the word lines of the fourth embodiment. Accordingly, the fifth embodiment is a ladder chain structure having the heater layers.

[5-1] Structure of Magnetic Random Access Memory

Figure 29:
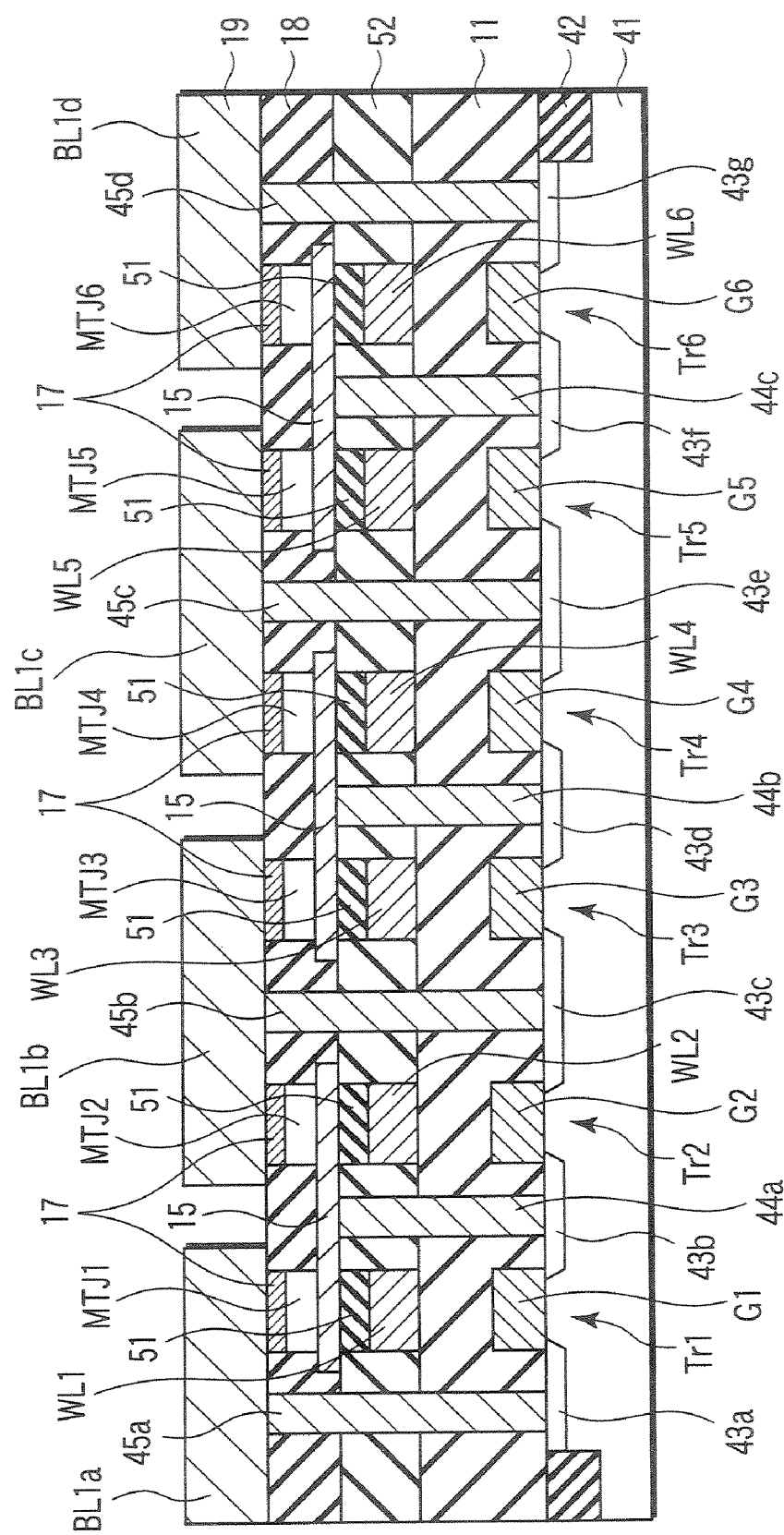
FIG. 29 is a sectional view showing a magnetic random access memory according to the fifth embodiment of the present invention.

FIG. 29 is a sectional view of a magnetic random access memory according to the fifth embodiment of the present invention. The structure of the magnetic random access memory according to the fifth embodiment will be explained below.

As shown in FIG. 29, the fifth embodiment differs from the fourth embodiment in that heater layers 51 are formed on word lines WL1 to WL6.

The heater layers 51 are stacked on and integrated with the word lines WL1 to WL6. The lower surfaces of the heater layers 51 are in contact with the word lines WL1 to WL6, and the upper surfaces of the heater layers 51 are in contact with lower electrodes 15. The word lines WL1 to WL6 and lower electrodes 15 are insulated by forming the heater layers 51 by using an insulating material. Note that when conductive heater layers 51 are used, an insulating film or the like need only be formed between the heater layers 51 and lower electrodes 15.

The heater layers 51 are heated by supplying an electric current to the word lines WL1 to WL6. Examples of the material of the heater layers 51 are those described in the third embodiment.

Note that the principle of the write operation is the same as that of the third and fourth embodiments, and the principle of the read operation is the same as that of the fourth embodiment.

[5-2] Effects

The fifth embodiment described above can achieve the same effects as in the first embodiment. In addition, the fifth embodiment can achieve the same effects as in the fourth embodiment by the ladder chain structure. Furthermore, the fifth embodiment can achieve the same effects as in the third embodiment by the heater layers 51.

[6] Sixth Embodiment

The sixth embodiment is an example in which the chain structure of the first embodiment comprises a plurality of stacked layers.

[6-1] Structure of Magnetic Random Access Memory

Figure 30:
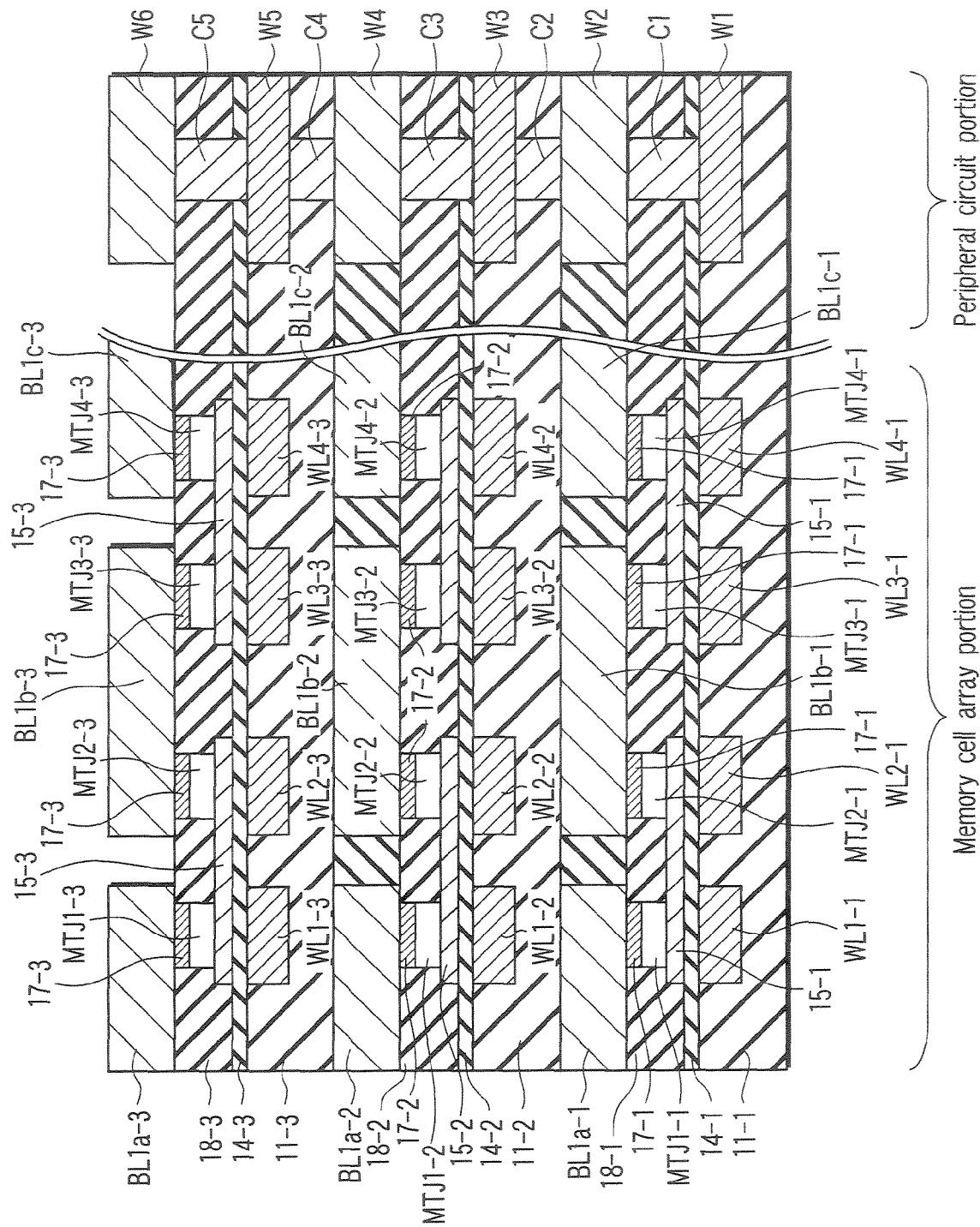
FIG. 30 is a sectional view showing a magnetic random access memory according to the sixth embodiment of the present invention.

FIG. 30 is a sectional view of a magnetic random access memory according to the sixth embodiment of the present invention. The structure of the magnetic random access memory according to the sixth embodiment will be explained below.

As shown in FIG. 30, the sixth embodiment differs from the first embodiment in that a plurality of chain structures are stacked perpendicularly to the substrate surface.

For one chain structure, a pair of write/read driver/sinker MOSFETs need only be formed. It is well possible to form the MOSFETs like this in the lower portion of the chain structure without increasing the cell array area.

In a peripheral circuit portion, word lines and bit lines used in the chain structure can also be used as normal logic interconnections (lines W1 to W6 and contacts C1 to C5). This makes it possible to increase the degree of integration without losing the space on the chip by the memory portion and logic portion.

Note that the write and read operations of the sixth embodiment are the same as those of the first embodiment, so a repetitive explanation will be omitted.

[6-2] Effects

The sixth embodiment described above can achieve the same effects as in the first embodiment. In addition, the chain structures are stacked in the sixth embodiment. This makes it possible to achieve a memory size much smaller than $4 F^2$ that is impossible in principle by the conventional cell array arrangement. As a consequence, a highly integrated memory device can be provided.

[7] Seventh Embodiment

The seventh embodiment is a modification of the first embodiment, and an example in which word lines are shifted from MTJ elements.

[7-1] Structure of Magnetic Random Access Memory

Figure 31:
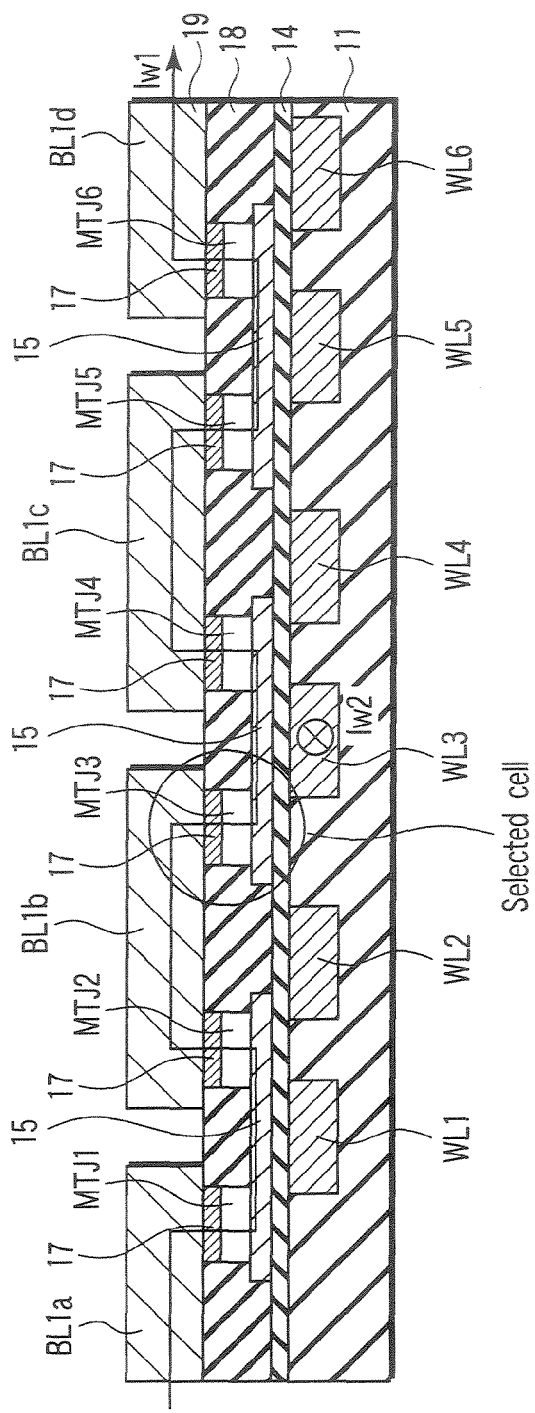
FIG. 31 is a sectional view showing a magnetic random access memory according to the seventh embodiment of the present invention.

FIG. 31 is a sectional view of a magnetic random access memory according to the seventh embodiment of the present invention. The structure of the magnetic random access memory according to the seventh embodiment will be explained below.

As shown in FIG. 31, the seventh embodiment differs from the first embodiment in that word lines are shifted from MTJ elements.

That is, word lines WL1 to WL6 are not formed immediately below NTJ elements MTJ1 to MTJ6, and hence do not oppose the NTJ elements NTJ1 to MTJ6. For example, the word line WL1 is formed below the portion between the NTJ elements NTJ1 and MTJ2, and the word line WL2 is formed below the portion between the NTJ elements MTJ2 and MTJ3.

Note that in this embodiment having the above structure, each NTJ element is desirably a perpendicular magnetization type element.

[7-2] Write Method

The write operation of the seventh embodiment is basically the same as that of the first embodiment. That is, as shown in FIG. 31, when writing data in the MTJ element MTJ3 of a selected cell, a write current Iw1 is supplied to the chain structure, and spin-polarized electrons generated by the write current Iw1 are allowed to act on the magnetization in the recording layer of the NTJ element MTJ3. In this state an electric current Iw2 is supplied to the word line WL3 corresponding to the selected cell, and a current magnetic field H generated by the electric current Iw2 is applied to the NTJ element MTJ3. Accordingly, the spin-polarized electrons generated by the electric current Iw1 and the current magnetic field H generated by the electric current Iw2 are acting on the MTJ element MTJ3 of the selected cell.

Although the write current Iw2 is supplied to the word line WL3 in this example, the present invention is not limited to this example. For example, the write current Iw2 may also be supplied to the word line WL2 or to both the word lines WL2 and WL3.

Note that the read operation of the seventh embodiment is the same as that of the first embodiment, so a repetitive explanation will be omitted.

[7-3] Effects

The seventh embodiment described above can achieve the same effects as in the first embodiment. In addition, in the seventh embodiment, the word lines WL are formed not immediately below the MTJ elements MTJ but obliquely to the MTJ elements MTJ. In a perpendicular magnetization type MTJ element, therefore, a perpendicular magnetic field can be efficiently applied by applying the magnetic field not from directly below but obliquely.

[8] Eighth Embodiment

The eighth embodiment is a modification of the first embodiment, and an example in which one word line is formed for two MTJ elements.

[8-1] Structure of Magnetic Random Access Memory

Figure 32:
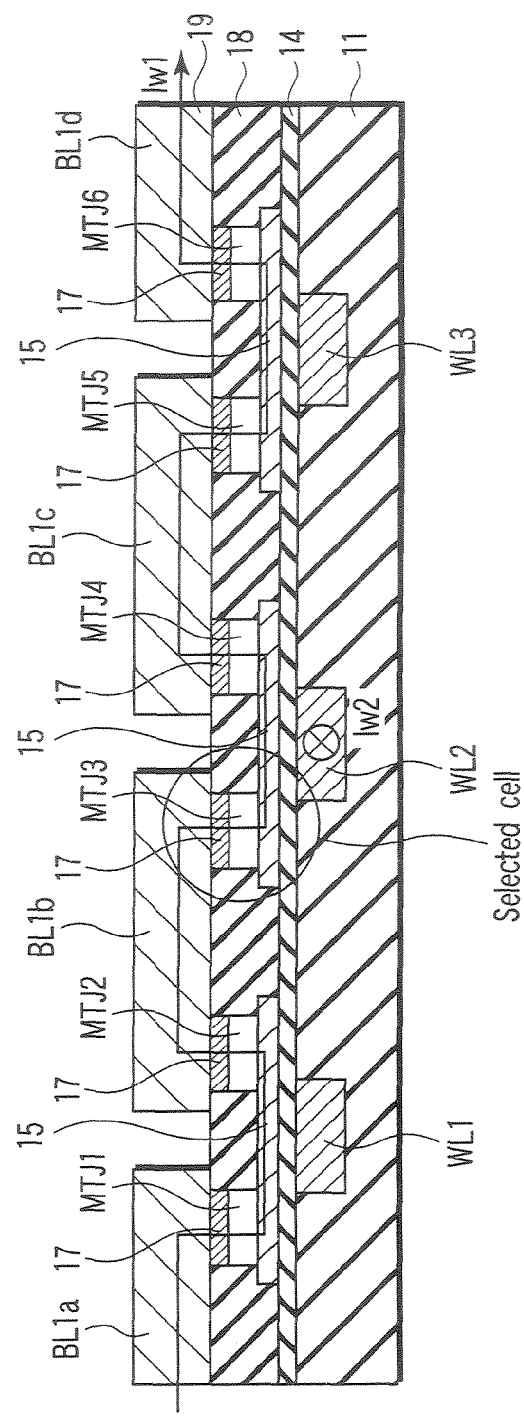
FIG. 32 is a sectional view showing a magnetic random access memory according to the eighth embodiment of the present invention.

FIG. 32 is a sectional view of a magnetic random access memory according to the eighth embodiment of the present invention. The structure of the magnetic random access memory according to the eighth embodiment will be explained below.

As shown in FIG. 32, the eighth embodiment differs from the first embodiment in that word lines are not formed in one-to-one correspondence with MTJ elements, but one word line is formed for every two cells.

That is, a word line WL1 is formed below a lower electrode 15 between MTJ elements MTJ1 and MTJ2, a word line WL2 is formed below a lower electrode 15 between MTJ elements MTJ3 and MTJ4, and a word line WL3 is formed below a lower electrode 15 between MTJ elements MTJ5 and MTJ6. Accordingly, the MTJ elements MTJ1 and MTJ2 share the word line WL1, the MTJ elements MTJ3 and MTJ4 share the word line WL2, and the MTJ elements MTJ5 and MTJ6 share the word line WL3.

Note that in this embodiment having the above structure, the MTJ element is desirably a perpendicular magnetization type element, and assumed to have an asymmetrical hysteresis curve.

[8-2] Write Method

The write operation of the eighth embodiment is basically the same as that of the first embodiment. That is, as shown in FIG. 32, when writing data in the MTJ element MTJ3 of a selected cell, a write current Iw1 is supplied to the chain structure, and spin-polarized electrons generated by the write current Iw1 are allowed to act on the magnetization in the recording layer of the MTJ element MTJ3. In this state, an electric current Iw2 is supplied to the word line WL2 corresponding to the selected cell, and a current magnetic field H generated by the electric current Iw2 is applied to the MTJ element MTJ3. Accordingly, the spin-polarized electrons generated by the electric current Iw1 and the current magnetic field H generated by the electric current Iw2 are acting on the MTJ element MTJ3 of the selected cell.

In this embodiment, the correlation between the parallel state or antiparallel state of the MTJ element and the flowing direction of the electric current Iw1 controls the direction of the electric current Iw2 supplied to the word line WL and the direction of the write current Iw1 supplied to the chain structure. Therefore, the magnetic field of a word line formed for two bits writes data in one of two, right and left MTJ elements corresponding to the word line.

Note that the read operation of the eighth embodiment is the same as that of the first embodiment, so a repetitive explanation will be omitted.

[8-3] Effects

The eighth embodiment described above can achieve the same effects as in the first embodiment. In addition, one word line WL is formed for two MTJ elements in the eighth embodiment. This makes it possible to secure a wide peripheral circuit region in the direction of the word lines WL.

[9] Ninth Embodiment

The ninth embodiment uses the space below the chain structure of the first embodiment.

[9-1] Structure of Magnetic Random Access Memory

FIG. 33 is a sectional view of a magnetic random access memory according to the ninth embodiment of the present invention. The structure of the magnetic random access memory according to the ninth embodiment will be explained below.

As shown in FIG. 33, the ninth embodiment effectively uses a space S below the chain structure of the first embodiment described earlier. That is, a write driver, another logic circuit, and the like are formed in the space S.

Note that the write and read operations of the ninth embodiment are the same as those of the first embodiment, so a repetitive explanation will be omitted.

[9-2] Effects

The ninth embodiment described above can achieve the same effects as in the first embodiment. In addition, the space S below the chain structure can be effectively used in the ninth embodiment. For example, the region occupied by the peripheral circuit can be reduced by forming decoder transistors for driving electric currents of write lines in the lower portions of the cells. This makes it possible to increase the ratio occupied by the MRAM cells, and decrease the chip size.

[10] 10th Embodiment

Each of the above embodiments is an example of a magnetic random access memory using an MTJ element. By contrast, the 10th embodiment is an example of a phase change memory (PRAM: Phase Change Random Access Memory) using a phase change element that changes the storage state by heat.

[10-1] Structure of Phase Change Memory

FIG. 34 is a sectional view of the phase change memory according to the 10th embodiment of the present invention. The phase change memory according to the 10th embodiment will be explained below.

As shown in FIG. 34, the 10th embodiment differs from the above embodiments in that phase change elements PC1 to PC6 are used instead of the MTJ elements MTJ1 to MTJ6. The phase change elements PC1 to PC6 are made of a GST (chalcogenite)-based material such as $Ge_2Sb_2Te_5$. Heater layers 31 for heating the phase change elements PC1 to PC6 are formed on word lines WL1 to WL6.

[10-2] Write Method

In the 10th embodiment, when writing data in the phase change element PC3 of a selected cell, a write current Iw1 is supplied to the chain structure. The write current Iw1 flows perpendicularly to the film surface of the phase change element PC3. In this state, a write current Iw2 is supplied to the word line WL3 corresponding to the selected cell, and heats the heater layer 31. Consequently, the crystalline state of only the phase change element PC3 of the selected cell can be changed by the synthetic heat of heat generated by the heater layer 31 and heat generated by the electric current Iw1.

The phase change element PC has the characteristic that the resistance value increases in an amorphous state and decreases in a crystalline state. Data "1" and "0" are stored by switching these two states. In the magnetic random access memory, the resistance value is changed in accordance with the magnetization direction in the MTJ element by using the magnetic field or spin-polarized electrons. By contrast, in the phase change memory, the resistance value is changed by the crystalline state of the phase change element PC by using heat.

Note that the read operation of the 10th embodiment is the same as that of the first embodiment, so a repetitive explanation will be omitted.

[10-3] Effects

The 10th embodiment described above can achieve the same effects as in the above embodiments even in the phase change memory.

[11] 11th Embodiment

The 11th embodiment explains the block diagram and the equivalent circuit of the magnetic random access memory.

[11-1] Block Diagram

Figure 35:
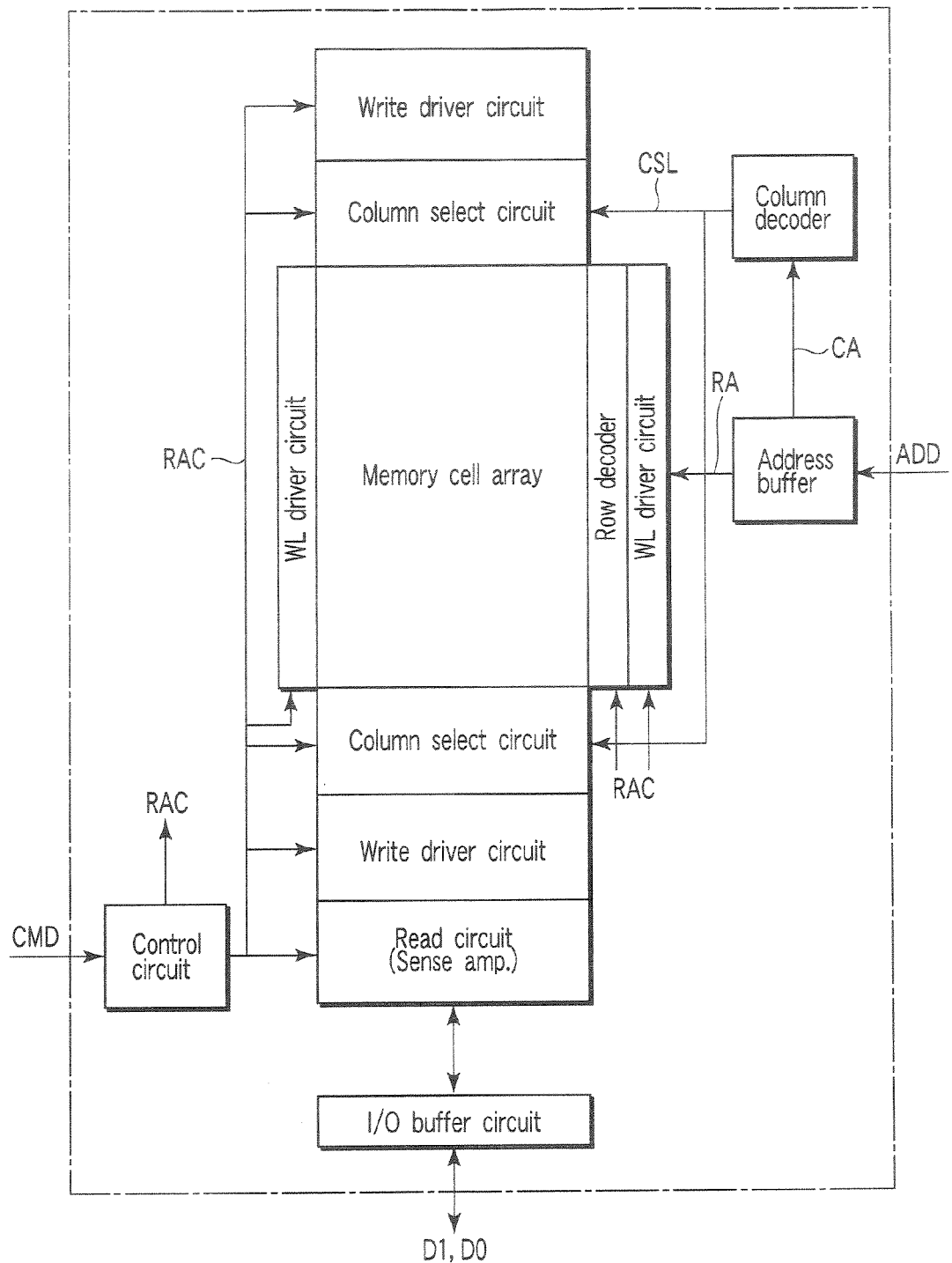
FIG. 35 is a block diagram showing a magnetic random access memory according to the 11th embodiment of the present invention.

FIG. 35 is the block diagram corresponding to the magnetic random access memory of the first to ninth embodiments of the present invention.

As shown in FIG. 35, a word line (WL) driver circuit, a row decoder, a column select circuit, a write driver circuit, a read circuit (sense amp), a column decoder, a control circuit, an I/O buffer circuit and an address buffer are arranged around a memory cell array.

An address signal ADD is inputted to the address buffer and a column address signal CA and a row address signal RA are outputted from the address buffer. The column decoder is controlled by the column address signal CA, and the WL driver circuit is controlled by the row address signal RA. The column select circuit is controlled by the CSL signal outputted from the column decoder.

A CMD signal is inputted to the control circuit and a RAC signal is outputted from the control circuit. The WL driver circuit, the row decoder, the column select circuit, the write driver circuit and the read circuit (sense amp) are controlled by the RAC signal.

The data D1 and D0 of the cell which began to be read from the read circuit (sense amp) are outputted through the I/O buffer circuit.

[11-2] Equivalent Circuit 1

Figure 36:
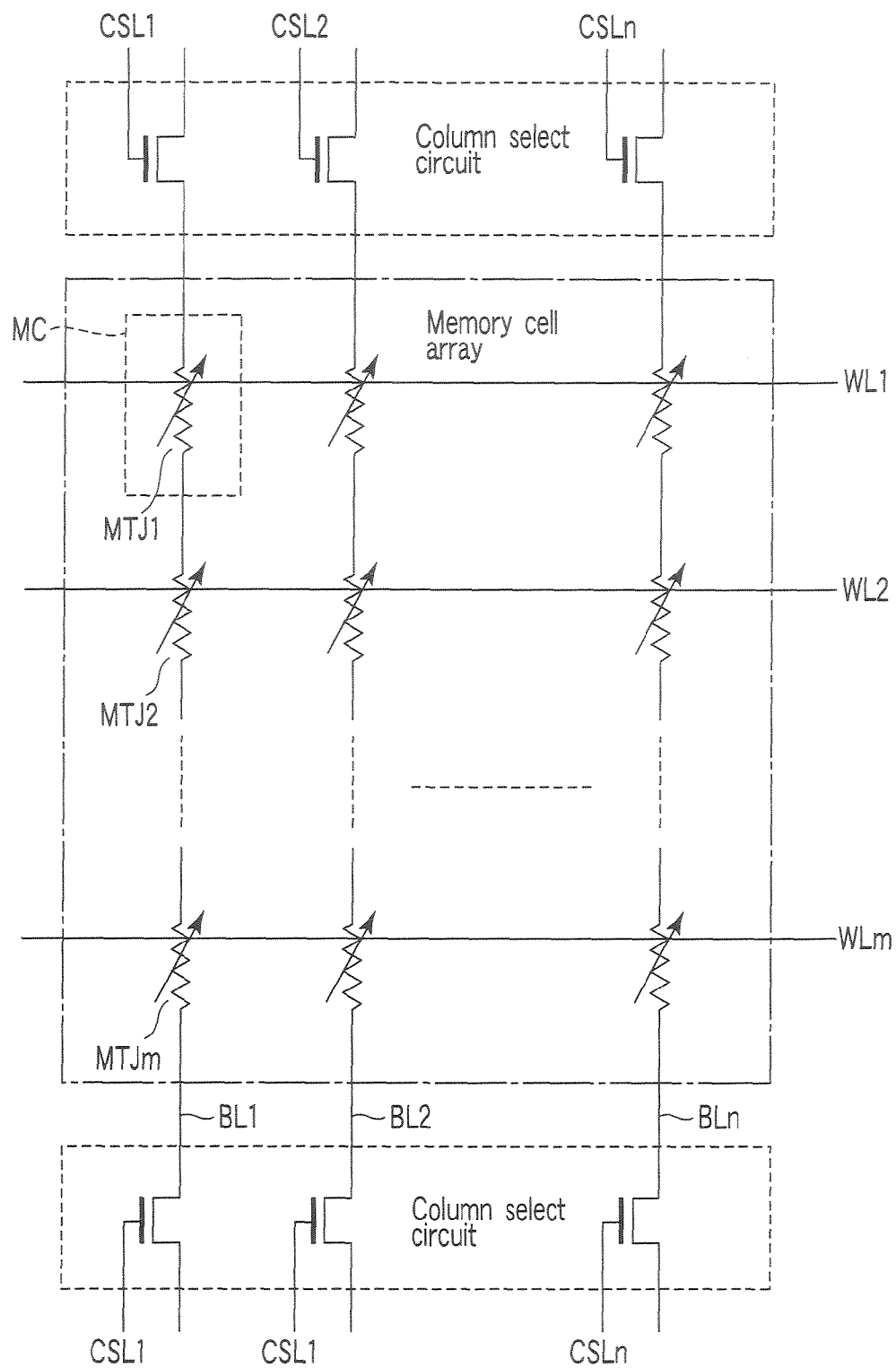
FIGS. 36 and 37 are equivalent circuits showing a magnetic random access memory according to the 11th embodiment of the present invention.

FIG. 36 is the equivalent circuit corresponding to the magnetic random access memory of the first to third embodiments of the present invention.

As shown in FIG. 36, a MTJ element MTJ is arranged with an intersection point between a bit line BL and a word line WL. For example, the MTJ elements which a series is connected to each other are connected to a bit line BL1. The column select circuit is connected to both ends of the bit line BL1. The transistor of the column select circuit is controlled by CSL1.

As shown in FIG. 35, the address signal ADD is divided into the row address signal RA and the column address signal CA and the block address signal BA (in some circuits; not shown) when inputted from the outside in the writing and reading operation. On the next step, a column address signal CA produces a CSL signal through the column decoder. The row address signal RA and the CSL signal are inputted to the row decoder and the column select circuit respectively. It activates the specific word line of FIG. 36 in WL1~$m$, and a specific CSL transistor in CSL1~$n$ turns on a gate, and activates a selected bit line (plural bit lines in multi-bit mode) by this.

On the other hand, the CMD signal produces the RAC signal through the control circuit. This RAC signal is inputted to the read circuit (sense amplifier), the write driver circuit, the column select circuit, the row decoder, and so on, and the writing and reading operation mode of the circuits are changed by the RAC signal.

Synchronizing with the address decoder circuit and the control circuit, I/O buffer circuit transfer the inputted D1/D0 data from the outer circuits to the writing circuits (write driver circuit and the column select circuit) during writing operation, and it transfer the amplified cell data (D1/D0) to the outer circuits during reading operation.

[11-3] Equivalent Circuit 2

Figure 37:
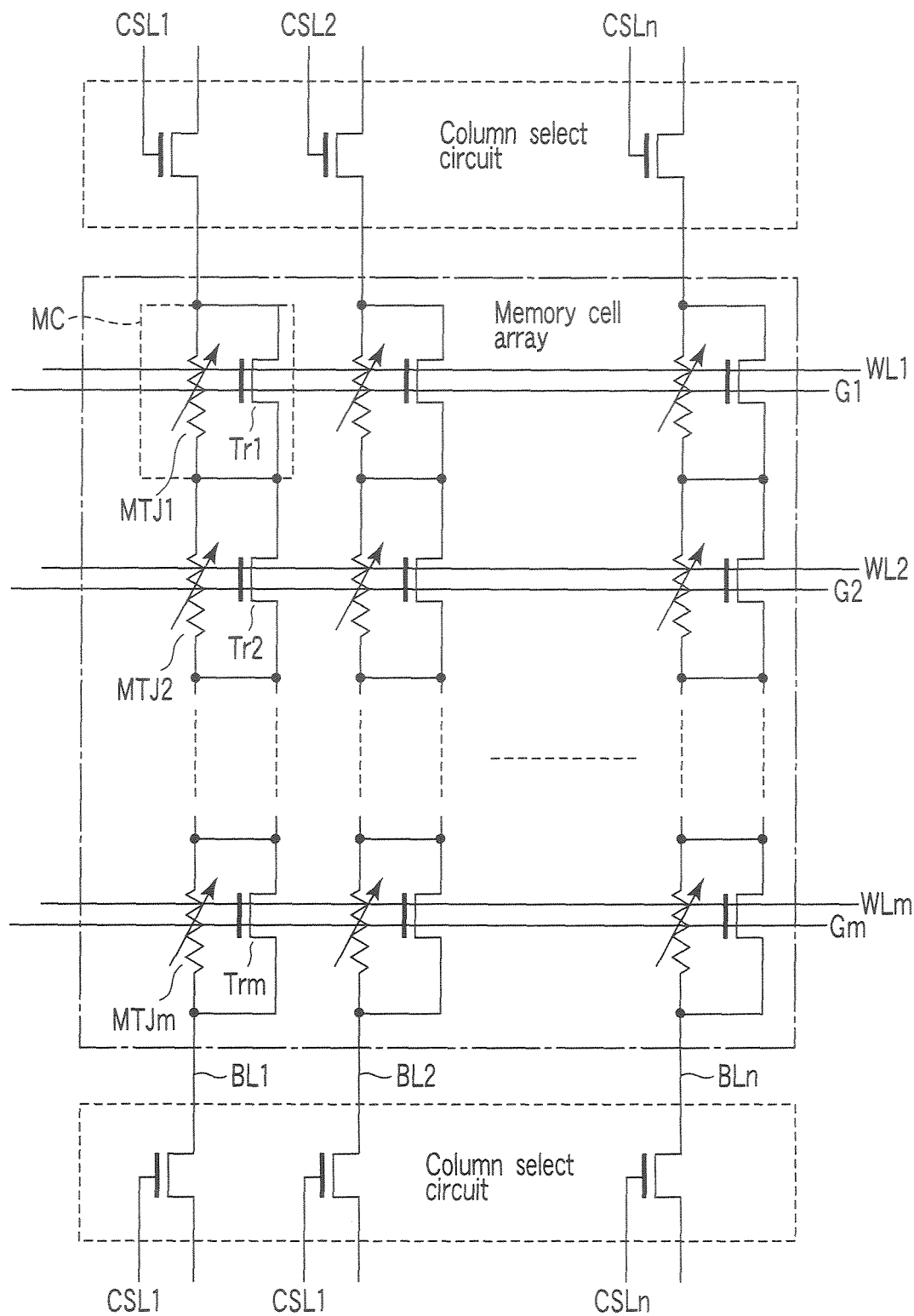

FIG. 37 is the equivalent circuit corresponding to the magnetic random access memory of the fourth and fifth embodiments of the present invention.

As shown in FIG. 37, for example, the transistor Tr1 is connected in parallel to the MTJ element MTJ1 to form one cell. The cells of the same bit line are connected in series.

As shown in FIG. 35, the address signal ADD is divided into the row address signal RA and the column address signal CA and the block address signal BA (in some circuits; not shown) when inputted from the outside in the writing and reading operation. On the next step, a column address signal CA produces a CSL signal through the column decoder. The row address signal RA and the CSL signal are inputted to the row decoder and the column select circuit respectively. It activates the specific word line of FIG. 37 in WL1~$m$, and a specific CSL transistor in CSL1~$n$ turns on a gate, and activates a selected bit line (plural bit lines in multi-bit mode) by this.

On the other hand, the CMD signal produces the RAC signal through the control circuit. This RAC signal is inputted to the read circuit (sense amplifier), the write driver circuit, the column select circuit, the row decoder, and so on, and the writing and reading operation mode of the circuits are changed by the RAC signal.

Synchronizing with the address decoder circuit and the control circuit, I/O buffer circuit transfer the inputted D1/D0 data from the outer circuits to the writing circuits (write driver circuit and the column select circuit) during writing operation, and it transfer the amplified cell data (D1/D0) to the outer circuits during reading operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a first resistance change element, a second resistance change element, a third resistance change element, and a fourth resistance change element sequentially arranged apart from each other in a first direction, and configured to record data when an electric current flows perpendicularly to a film surface;
   a first electrode which connects one terminal of the first resistance change element and one terminal of the second resistance change element;
   a second electrode which connects one terminal of the third resistance change element and one terminal of the fourth resistance change element;
   a bit line which connects the other terminal of the second resistance change element and the other terminal of the third resistance change element;
   a first word line, a second word line, a third word line, and a fourth word line respectively paired with the first resistance change element, the second resistance change element, the third resistance change element, and the fourth resistance change element, arranged apart from the first electrode and the second electrode, and running in a second direction different from the first direction;
   a first current source which supplies a first electric current to a chain structure having the first resistance change element, the second resistance change element, the third resistance change element, and the fourth resistance change element, the first electrode, the second electrode, and the bit line, when writing data in a selected element among the first resistance change element, the second resistance change element, the third resistance change element, and the fourth resistance change element; and
   a second current source which supplies a second electric current to a selected word line, among the first word line, the second word line, the third word line, and the fourth word line, which corresponds to the selected element, when writing the data in the selected element.

2. The device according to claim 1, wherein the first word line, the second word line, the third word line, and the fourth word line respectively oppose the first resistance change element, the second resistance change element, the third resistance change element, and the fourth resistance change element.

3. The device according to claim 1, further comprising:
   a first contact formed between the one terminal of the second resistance change element and the bit line, and having an area different from that of the second resistance change element; and
   a second contact formed between the one terminal of the third resistance change element and the bit line, and having an area different from that of the third resistance change element.

4. The device according to claim 1, further comprising a first heater layer, a second heater layer, a third heater layer, and a fourth heater layer formed between the first word line, second word line, third word line, and fourth word line and the first electrode and second electrode, respectively brought into contact with the first word line, the second word line, the third word line, and the fourth word line, insulated from the first electrode and the second electrode, and heated when the second electric current flows.

5. The device according to claim 1, further comprising:
a first transistor formed below the first resistance change element, and having a first current path whose two ends are connected in parallel to the two terminals of the first resistance change element;
a second transistor formed below the second resistance change element, and having a second current path whose two ends are connected in parallel to the two terminals of the second resistance change element;
a third transistor formed below the third resistance change element, and having a third current path whose two ends are connected in parallel to the two terminals of the third resistance change element;
a fourth transistor formed below the fourth resistance change element, and having a fourth current path whose two ends are connected in parallel to the two terminals of the fourth resistance change element;
a first contact which connects a first diffusion layer shared by the first transistor and the second transistor to the first electrode;
a second contact which connects a second diffusion layer shared by the third transistor and the fourth transistor to the second electrode; and
a third contact which connects a third diffusion layer shared by the second transistor and the third transistor to the bit line.

6. The device according to claim 5, further comprising a first heater layer, a second heater layer, a third heater layer, and a fourth heater layer formed between the first word line, second word line, third word line, and fourth word line and the first electrode and second electrode, respectively brought into contact with the first word line, the second word line, the third word line, and the fourth word line, insulated from the first electrode and the second electrode, and heated when the second electric current flows.

7. The device according to claim 1, wherein the chain structure comprises a plurality of chain structures stacked perpendicularly to the substrate surface.

8. The device according to claim 1, wherein the first word line, the second word line, the third word line, and the fourth word line are shifted from and do not oppose the first resistance change element, the second resistance change element, the third resistance change element, and the fourth resistance change element, respectively.

9. The device according to claim 1, wherein
the first word line is formed between the first resistance change element and the second resistance change element apart form the first electrode, and
the second word line is formed between the third resistance change element and the fourth resistance change element apart form the second electrode.

10. The device according to claim 1, wherein each of the first resistance change element, the second resistance change element, the third resistance change element, and the fourth resistance change element comprises a magnetoresistive effect element including a fixed layer in which a magnetization direction is fixed, a recording layer in which a magnetization direction changes, and a nonmagnetic layer formed between the fixed layer and the recording layer.

11. The device according to claim 10, wherein magnetization in the fixed layer and the recording layer points in a direction parallel to the film surface.

12. The device according to claim 10, wherein magnetization in the fixed layer and the recording layer points in a direction perpendicular to the film surface.

13. The device according to claim 4, wherein each of the first resistance change element, the second resistance change element, the third resistance change element, and the fourth resistance change element comprises a phase change element which changes a storage state by heat.

14. A write method of a semiconductor memory device, wherein
the semiconductor memory device comprises:
a first resistance change element, a second resistance change element, a third resistance change element, and a fourth resistance change element sequentially arranged with a predetermined interval therebetween in a first direction, and configured to record data when an electric current flows perpendicularly to a film surface;
a first electrode which connects one terminal of the first resistance change element and one terminal of the second resistance change element;
a second electrode which connects one terminal of the third resistance change element and one terminal of the fourth resistance change element;
a bit line which connects the other terminal of the second resistance change element and the other terminal of the third resistance change element; and
a first word line, a second word line, a third word line, and a fourth word line respectively paired with the first resistance change element, the second resistance change element, the third resistance change element, and the fourth resistance change element, arranged apart from the first electrode and the second electrode, and running in a second direction different from the first direction, and
when writing data in a selected element among the first resistance change element, the second resistance change element, the third resistance change element, and the fourth resistance change element in a chain structure having the first resistance change element, the second resistance change element, the third resistance change element, the fourth resistance change element, the first electrode, the second electrode, and the bit line, while a first electric current is supplied to the chain structure to cause spin-polarized electrons to act on the selected element, a current magnetic field is applied to the selected element by supplying a second electric current to a selected word line, among the first word line, the second word line, the third word line, and the fourth word line, which corresponds to the selected element, thereby decreasing a magnetization reversal threshold value of the selected element.

15. The method according to claim 14, wherein the supply of the first electric current is started after the supply of the second electric current is started.

16. The method according to claim 14, wherein the supply of the second electric current is started after the supply of the first electric current is started.

17. The method according to claim 14, wherein the supply of the first electric current and the supply of the second electric current are simultaneously started.

18. The method according to claim 14, wherein
the semiconductor memory device further comprises a first heater layer, a second heater layer, a third heater layer, and a fourth heater layer formed between the first word line, second word line, third word line, and fourth word line and the first electrode and second electrode, respectively brought into contact with the first word line, the second word line, the third word line, and the fourth word line, and insulated from the first electrode and the second electrode, and a selected heater layer in contact with the selected word line is heated by supplying the second electric current, and the selected element is heated by the heat of the selected heater layer, thereby decreasing the magnetization reversal threshold value of the selected element.

19. A read method of a semiconductor memory device, wherein the semiconductor memory device comprises:

a first resistance change element, a second resistance change element, a third resistance change element, and a fourth resistance change element sequentially arranged with a predetermined interval therebetween in a first direction, and configured to record data when an electric current flows perpendicularly to a film surface;

a first electrode which connects one terminal of the first resistance change element and one terminal of the second resistance change element;

a second electrode which connects one terminal of the third resistance change element and one terminal of the fourth resistance change element;

a bit line which connects the other terminal of the second resistance change element and the other terminal of the third resistance change element; and a first word line, a second word line, a third word line, and a fourth word line respectively paired with the first resistance change element, the second resistance change element, the third resistance change element, and the fourth resistance change element, arranged apart from the first electrode and the second electrode, and running in a second direction different from the first direction, when reading out data from a selected element among the first resistance change element, the second resistance change element, the third resistance change element, and the fourth resistance change element in a chain structure having the first resistance change element, the second resistance change element, the third resistance change element, the fourth resistance change element, the first electrode, the second electrode, and the bit line, the method comprises:

reading out a first resistance value of the selected element by supplying a first electric current to the chain structure;

reading out a second resistance value of the selected element by supplying a second electric current to the chain structure in a direction opposite to that of the first electric current; and discriminating the data of the selected element in accordance with changes in the first resistance value and the second resistance value, and when reading out the first resistance value and the second resistance value, a third electric current is supplied to a selected word line, among the first word line, the second word line, the third word line, and the fourth word line, which corresponds to the selected element.

20. The method according to claim 19, further comprising writing back the data of the selected element by supplying a fourth electric current to the chain structure in the same direction as that of the first electric current.

* * * * *